(12) United States Patent
Lim et al.

(10) Patent No.: US 9,337,202 B2
(45) Date of Patent: May 10, 2016

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Sung-Won Lim, Gyeonggi-do (KR); Seung-Jin Yeom, Gyeonggi-do (KR); Hyo-Seok Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/857,550

(22) Filed: Sep. 17, 2015

(65) Prior Publication Data

US 2016/0005743 A1  Jan. 7, 2016

Related U.S. Application Data

(63) Continuation of application No. 14/040,162, filed on Sep. 27, 2013, now Pat. No. 9,165,859.

(30) Foreign Application Priority Data

Apr. 8, 2013  (KR) .......................... 10-2013-0038175

(51) Int. Cl.
| | |
|---|---|
| *H01L 21/4763* | (2006.01) |
| *H01L 27/108* | (2006.01) |
| *H01L 23/48* | (2006.01) |
| *H01L 21/285* | (2006.01) |
| *H01L 21/768* | (2006.01) |

(52) U.S. Cl.
CPC .... *H01L 27/10885* (2013.01); *H01L 21/28518* (2013.01); *H01L 21/7682* (2013.01); *H01L21/7684* (2013.01); *H01L 21/7685* (2013.01); *H01L 21/76802* (2013.01); *H01L 21/76877* (2013.01); *H01L 23/48* (2013.01); *H01L 27/10855* (2013.01); *H01L 27/10876* (2013.01); *H01L 27/10888* (2013.01); *H01L 2924/0002* (2013.01)

(58) Field of Classification Search
CPC ............ H01L 27/11578; H01L 21/764; H01L 21/76879; H01L 2224/48227; H01L 2224/83; H01L 2224/85; H01L 23/5329; H01L 23/535; H01L 23/49513; H01L 24/05; H01L 24/24; H01L 24/32; H01L 24/48; H01L 24/95; H01L 51/5203; H01L 21/28; H01L 29/16; H01L 29/45; H01L 27/0688; H01L 27/11521; H01L 27/11551; H01L 21/8221; H01L 27/11529; H01L 27/11568; H01L 29/78696; H01L 45/1683; H01L 27/11; H01L 27/2472; H01L 28/40; H01L 27/11507; H01L 27/1156; H01L 27/115; H01L 45/00; H01L 29/788; H01L 29/792; H01L 27/108; H01L 21/76; H01L 21/8239; G02F 1/133345; G02F 1/136227; G02F 2001/133757; G11C 13/0026; G11C 7/18
USPC ...................... 257/621, 774, 751, 4, E45.002; 438/629, 630, 637–640, 668, 672, 675

See application file for complete search history.

(56) References Cited

U.S. PATENT DOCUMENTS

| | | | |
|---|---|---|---|
| 8,999,837 B2 * | 4/2015 | Park ................... | H01L 21/76814 438/619 |
| 2011/0121851 A1 * | 5/2011 | Lee ..................... | G01R 1/07371 324/756.03 |

(Continued)

*Primary Examiner* — Dao H Nguyen
*Assistant Examiner* — Tram H Nguyen
(74) *Attorney, Agent, or Firm* — IP & T Group LLP

(57) ABSTRACT

A semiconductor device includes a first conductive structure including a first conductive pattern that is formed over a substrate, a second conductive structure formed adjacent to a sidewall of the first conductive structure, and an insulation structure including an air gap that is formed between the first conductive structure and the second conductive structure, wherein the second conductive structure includes a second conductive pattern, an ohmic contact layer that is to formed over the second conductive pattern, and a third conductive pattern that is formed over the ohmic contact layer and is separated from the first conductive pattern through the air gap.

17 Claims, 26 Drawing Sheets

(56) References Cited

U.S. PATENT DOCUMENTS

| | | | |
|---|---|---|---|
| 2012/0146221 A1* | 6/2012 | Shim | H01L 27/10876 257/741 |
| 2012/0168899 A1* | 7/2012 | Kim | H01L 21/7682 257/522 |
| 2013/0221309 A1* | 8/2013 | Lee | H01L 45/085 257/2 |
| 2014/0357076 A1* | 12/2014 | Joung | H01L 21/764 438/652 |
| 2015/0206800 A1* | 7/2015 | Lee | H01L 23/5329 438/627 |

* cited by examiner

SEMICONDUCTOR DEVICE WITH AIR GAP AND METHOD FOR FABRICATING THE SAME

CROSS-REFERENCE TO RELATED APPLICATIONS

This application is a continuation of U.S. patent application Ser. No. 14/040,162 filed on Sep. 27, 2013, which claims priority of Korean Patent Application No. 10-2013-0038175, filed on Apr. 8, 2013. The disclosure of each of the foregoing applications is incorporated herein by reference in its entirety.

BACKGROUND

1. Field

Exemplary embodiments of the present invention relate to a semiconductor device, and more particularly, to a semiconductor device with air gaps and a method for fabricating the same.

2. Description of the Related Art

In general, in a semiconductor device, a dielectric material is formed between adjacent conductive structures. As a semiconductor device is highly integrated, a distance between conductive structures is gradually decreasing. Due to this fact, parasitic capacitance increases. As parasitic capacitance increases, the performance of the semiconductor device is degraded.

In order to reduce parasitic capacitance, the dielectric constant of a dielectric material may be decreased. However, since the dielectric material has a high dielectric constant, limitations may exist in reducing parasitic capacitance.

SUMMARY

Various exemplary embodiments of the present invention are directed to a semiconductor device that may reduce the parasitic capacitance between adjacent conductive structures, and a method for fabricating the same.

In accordance with an exemplary embodiment of the present invention, a semiconductor device may include a first conductive structure including a first conductive pattern formed over a substrate, a second conductive structure formed adjacent to a sidewall of the first conductive structure, over the substrate, and an insulation structure including an air gap formed between the first conductive structure and the second conductive structure, over the substrate, wherein the second conductive structure includes a second conductive pattern, an ohmic contact layer formed over the second conductive pattern, and a third conductive pattern formed over the ohmic contact layer.

In accordance with another exemplary embodiment of the present invention, a semiconductor device may include a bit line structure including a bit line, formed over a substrate, a storage node contact plug formed adjacent to a sidewall of the bit line structure, over the substrate, and an insulation structure including an air gap formed between the bit line structure and the storage node contact plug, over the substrate, wherein the storage node contact plug includes a first plug, an ohmic contact layer formed over the first plug, and a second plug formed over the ohmic contact layer.

In accordance with still another embodiment of the present invention, a method for fabricating a semiconductor device may include forming a dielectric layer over a substrate, defining an opening by etching the dielectric layer, forming a first conductive pattern in the opening, forming sacrificial spacer on sidewalls of the opening over the first conductive pattern, forming an ohmic contact layer over the first conductive pattern, forming a second conductive pattern over the ohmic contact layer, defining air gap by removing the sacrificial spacer, and forming a third conductive pattern over the second conductive pattern to cap the air gap. The forming of the third conductive pattern may include forming a barrier layer over an entire surface including the second conductive pattern and the air gap, forming a conductive layer over the barrier layer to fill the opening, and planarizing the conductive layer and the barrier layer. Each of the barrier layer and the conductive layer may include a metal-containing material. After the forming of the sacrificial spacer, the method may further include recessing a surface of the first conductive pattern. The first conductive pattern may include a silicon-containing material. Each of the second conductive pattern and the third conductive pattern may include a metal-containing material. The ohmic contact layer may include cobalt silicide with a phase of $CoSi_2$.

In accordance with still another embodiment of the present invention, a method for fabricating a semiconductor device may include forming a plurality of conductive structures which include first conductive patterns, over a substrate, forming a dielectric layer over the conductive structures, defining openings between the conductive structures by etching the dielectric layer, forming second conductive patterns which are recessed to be lower than the first conductive patterns, in the openings, forming sacrificial spacers on sidewalls of the openings over the second conductive patterns, forming an ohmic contact layer over the second conductive patterns, forming third conductive patterns over the ohmic contact layer, defining air gaps by removing the sacrificial spacers, and forming fourth conductive patterns over the third conductive patterns, to cap the air gaps. After the forming of the sacrificial spacers, the method may further include recessing surfaces of the second conductive patterns in a manner self-aligned with the sacrificial spacers. The first conductive patterns may include bit lines. Stack structures of the second conductive patterns, the ohmic contact layer, the third conductive patterns and the fourth conductive patterns may include storage node contact plugs. The second conductive patterns may include a silicon-containing material, and the third conductive patterns may include a metal-containing material. The ohmic contact layer may include cobalt silicide with a phase of $CoSi_2$. The forming of the fourth conductive patterns may include forming a barrier layer to cap the third conductive patterns and the air gaps, forming a metal-containing layer over the barrier layer to fill the openings, and planarizing the metal-containing layer and the barrier layer. The barrier layer may include a titanium-containing material. Before the forming of the conductive structures, the method may further include forming buried gate type transistors which include gate electrodes buried in the substrate. After the forming of the fourth conductive patterns, the method may further include forming capacitors over the fourth conductive patterns.

DETAILED DESCRIPTION

Figure 1A:
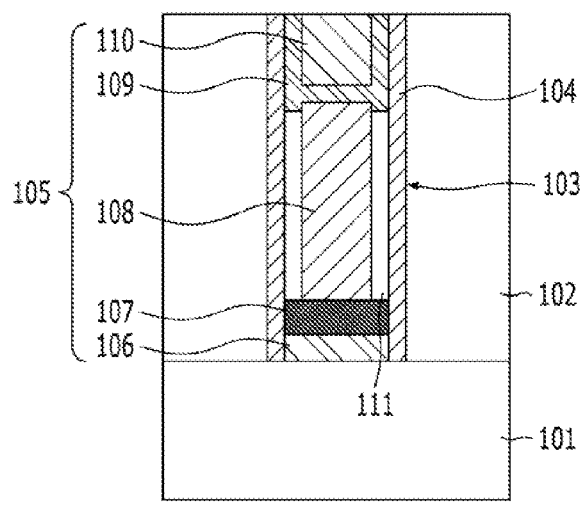
FIG. 1A is a cross-sectional view illustrating a semiconductor device in accordance with a first embodiment of the present invention.

Various embodiments will be described below in more detail with reference to the accompanying drawings. The present invention may however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1A is a cross-sectional view illustrating a semiconductor device in accordance with a first embodiment of the present invention.

Referring to FIG. 1A, a dielectric layer 102 is formed on a substrate 101. An opening 103 is formed in the dielectric layer 102. The opening 103 exposes the surface of the substrate 101. A conductive structure 105 is formed in the opening 103. The conductive structure 105 includes a first conductive pattern 106, a second conductive pattern 108 and a third conductive pattern 110. The first conductive pattern 106 is formed by being recessed in the opening 103. The second conductive pattern 108 is formed over the first conductive pattern 106. An ohmic contact layer 107 is formed between the first conductive pattern 106 and the second conductive pattern 108. A barrier pattern 109 is formed between the second conductive pattern 108 and the third conductive pattern 110. The conductive structure 105 may be a structure in which the first conductive pattern 106, the ohmic contact layer 107, the second conductive pattern 108, the barrier pattern 109 and the third conductive pattern 110 are stacked. An air gap 111 is formed between the conductive structure 105 and the sidewalls of the opening 103. The second conductive pattern 108 may be separated from the sidewalls of the opening 103 through the air gap 111. The second conductive pattern 108 has a line width smaller than that of the first conductive pattern 106. The barrier pattern 109 caps the second conductive pattern 108 and the air gap 111. A spacer 104 is formed on the sidewalls of the opening 103.

The substrate 101 includes a silicon substrate or a silicon-germanium substrate. The substrate 101 may include a silicon-on-insulator (SOI) substrate. The dielectric layer 102 includes a low-k material. The dielectric layer 102 may include silicon nitride or silicon oxide. The dielectric layer 102 becomes an interlayer dielectric layer.

The opening 103 may have a hole shape or a line shape. For instance, the opening 103 may be defined as a contact hole, a via hole, a through hole, a trench, a recess, and the like. In the case where the opening 103 is a contact hole, the conductive structure 105 becomes a contact plug.

The first conductive pattern 106 includes a silicon-containing layer. The first conductive pattern 106 may include polysilicon. The polysilicon may be doped with impurities.

Each of the second conductive pattern 108 and the third conductive pattern 110 includes a meta containing layer such as a metal, a metal nitride, a metal silicide and a metal carbide. For example, each of the second conductive pattern 108 and the third conductive pattern 110 may include tungsten. The second conductive pattern 108 has a volume larger than that of the first conductive pattern 106. The second conductive pattern 108 has a line width smaller than that of the first conductive pattern 106 and a height larger than that of the first conductive pattern 106. Since the volume of the second conductive pattern 108 is larger than that of the first conductive pattern 106 in this way, the resistance of the conductive structure 105 is dominantly determined by the second conductive pattern 108.

When the first conductive pattern 106 and the second conductive pattern 108 contact each other, an ohmic contact is required. To this end, the ohmic contact layer 107 is formed. The ohmic contact layer 107 includes a metal silicide. The metal silicide includes cobalt silicide. The cobalt silicide includes cobalt silicide with the phase of $CoSi_2$.

The spacer 104 includes a low-k material. The low-k material includes an oxide or a nitride. The low-k material may include silicon oxide, silicon nitride or a metal oxide. The spacer 104 includes $SiO_2$, $Si_3N_4$ or SiN.

The air gap 111 may be formed by removing a sacrificial material. The sacrificial material is formed between the spacer 104 and the second conductive pattern 108. By removing the sacrificial material after forming the ohmic contact layer 107, the air gap 111 is formed. This will be described later.

The barrier pattern 109 caps the second conductive pattern 108 and the air gap 111. Furthermore, the barrier pattern 109 covers the sidewall portions of the opening 103 on the air gap 111. The barrier pattern 109 includes a titanium-containing layer. The barrier pattern 109 may include titanium nitride. The barrier pattern 109 is formed by chemical vapor deposition (CVD) or physical vapor deposition (PVD).

Figure 1B:
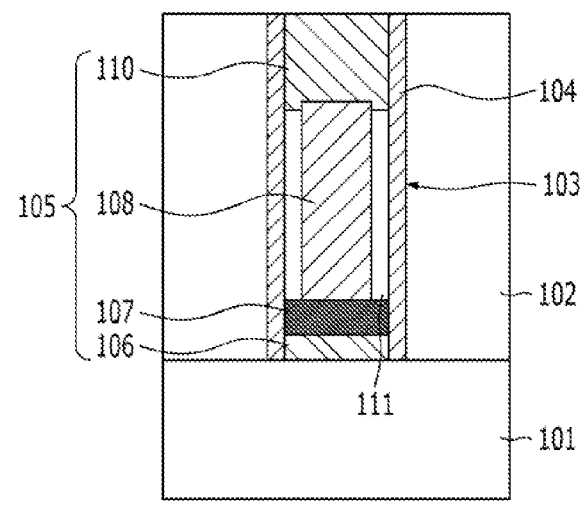
FIG. 1b is a cross-sectional view illustrating a semiconductor device in accordance with a variation of the first embodiment of the present invention.

FIG. 1B is a cross-sectional view illustrating a semiconductor to device in accordance with a variation of the first embodiment of the present invention.

Referring to FIG. 1B, unlike FIG. 1A, the air gap 111 and the second conductive pattern 108 are capped using the third conductive pattern 110 without using a barrier pattern.

The conductive structure 105 according to FIGS. 1A and 1B may be a contact plug, an electrode, or the like. In the case of a contact plug, the first conductive pattern 106 may be a plug pad and the second conductive pattern 108 may be a main plug. The third conductive pattern 110 and the barrier pattern 109 may be a capping structure that caps the air gap 111. Since the second conductive pattern 108 as a main plug includes a metal containing layer, the resistance of the contact plug is reduced. That is to say, by minimizing the volume of the first conductive pattern 106 as a silicon-containing layer and maximizing the volume of the second conductive pattern 108 as a metal-containing layer, the resistance of the contact plug may be reduced. Furthermore, since the ohmic contact layer 107 is included, resistance is further reduced, and since the area of the ohmic contact layer 107 is large, resistance is further reduced.

Further, the conductive structure 105 may be a bit line, a metal line, a gate electrode, a word line, or the like.

As can be readily seen from the above descriptions, by defining the air gap 111, the electrical insulation characteristic of the conductive structure 105 is improved. For instance, in the case where another conductive pattern is positioned adjacent to the second conductive pattern 108, the parasitic capacitance between the two conductive patterns is reduced.

Further, since the ohmic contact layer 107 is formed under the air gap 111, an area over which the ohmic contact layer 107 is to be formed may be increased. According to this fact, interfacial resistance may be reduced.

Also, since the volume of the second conductive pattern 108 as a metal-containing material is larger than the volume of the first conductive pattern 106 as a silicon-containing material in the conductive structure 105, the contact resistance of the conductive structure 105 may be reduced.

FIGS. 2A to 2I are cross-sectional views showing an exemplary method for fabricating the semiconductor device in accordance with the first embodiment of the present invention.

Figure 2A:
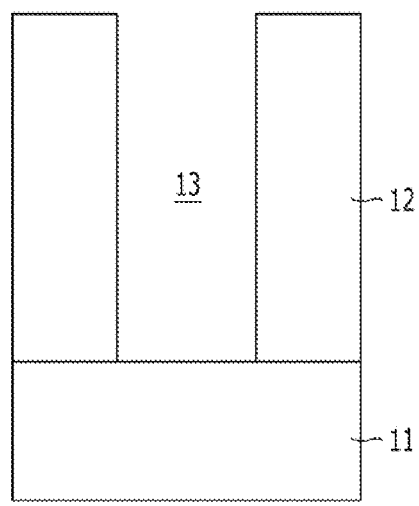
FIGS. 2A to 2I are cross-sectional views showing an exemplary method for fabricating the semiconductor device in accordance with the first embodiment of the present invention.

Referring to FIG. 2A, a dielectric layer 12 is formed on a substrate 11. The substrate 11 includes a semiconductor substrate. The substrate 11 contains silicon. The substrate 11 may include a silicon substrate or a silicon germanium substrate. The substrate 11 may include an SOI substrate. The dielectric layer 12 includes a low-k material. The dielectric layer 12 may include silicon nitride or silicon oxide.

An opening 13 is formed in the dielectric layer 12. By etching the dielectric layer 12, the opening 13 is formed in such a way as to expose the surface of the substrate 11. The opening 13 has a hole shape or a line shape. The opening 13 may be defined as a contact hole, a via hole, a through hole, a trench, a recess, or the like. A plurality of openings 13 may be arranged at regular intervals in such a way as to define an opening array. In order to etch the dielectric layer 12, a mask pattern (not shown) may be used. The mask pattern includes a photoresist pattern or a hard mask pattern that is patterned using a photoresist pattern.

Figure 2B:
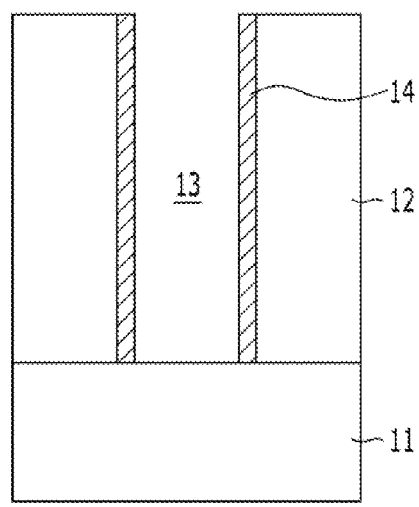

Referring to FIG. 2B, a spacer 14 is formed on the sidewalls of the opening 13. After forming a dielectric layer (not shown) to include the opening 13, the dielectric layer is etched by an etch-back process. In this way, the spacer 14 is formed. The spacer 14 includes a low-k material. The spacer 14 may include silicon nitride. By forming the spacer 14, the surface of the substrate 11 is exposed on the bottom of the opening 13.

Figure 2C:
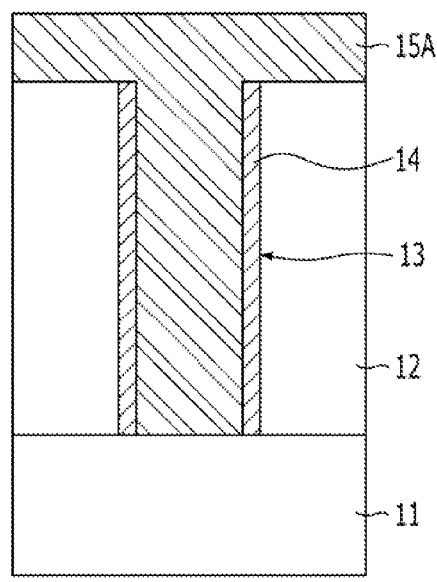

Referring to FIG. 2C, a first conductive layer 15A is formed. The first conductive layer 15A is formed on the dielectric layer 12 including the spacer 14 in such a way as to fill the opening 13. The first conductive layer 15A includes a silicidable material. The first conductive layer 15A may include a silicon-containing layer. The first conductive layer 15A may include polysilicon. The polysilicon may be doped with impurities. The first conductive layer 15A contacts the surface of the substrate 11.

Figure 2D:
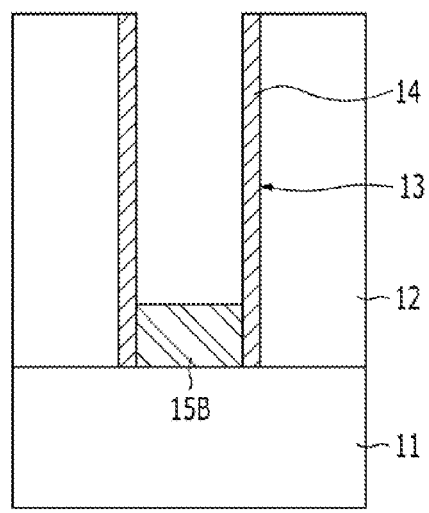

Referring to FIG. 2D, the first conductive layer 15A is selectively removed. According to this fact, a first conductive pattern 15B is formed in such a way as to be recessed. In order to form the first conductive pattern 15B, an etch-back process may be applied. The first conductive pattern 15B has a surface that is recessed to be lower than the upper surface of the dielectric layer 12. The height of the first conductive pattern 15B may be controlled as low as possible. This is to minimize a volume that is occupied by the first conductive pattern 15B in a conductive structure.

Figure 2E:
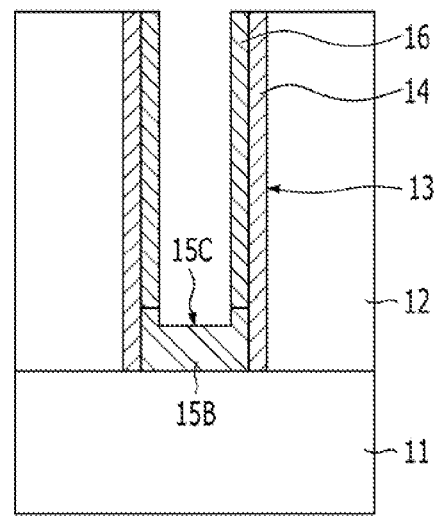

Referring to FIG. 2E, a sacrificial spacer 16 is formed. The sacrificial spacer 16 is formed on the sidewalls of the opening 13 on the first conductive pattern 15B. The sacrificial spacer 16 may be formed by selectively etching a sacrificial layer (not shown). In order to form the sacrificial spacer 16, a dry etching process may be applied. For example, the dry etching process may include an etch-back process. By the sacrificial spacer 16, the upper surface of the first conductive pattern 15B may be exposed and the upper surface of the dielectric layer 12 may be exposed. The sacrificial spacer 16 is a material that is removed in a subsequent process to define an air gap. The sacrificial spacer 16 may include a material that has an etching selectivity with respect to the dielectric layer 12. The sacrificial spacer 16 may include a dielectric material. The sacrificial spacer 16 may include a material different from the dielectric layer 12. For example, in the case where the dielectric layer 12 includes silicon oxide, the sacrificial spacer 16 may include silicon nitride. Otherwise, in the case where the dielectric layer 12 includes silicon nitride, the sacrificial spacer 16 may include silicon oxide. The sacrificial spacer 16 may be formed by stacking a silicon oxide layer and a silicon nitride layer.

When forming the sacrificial spacer 16 or after forming the sacrificial spacer 16, the surface of the first conductive pattern 15B may be recessed by a predetermined depth (see the reference numeral 15C). This is to increase a reaction area for subsequently forming a silicide layer.

Figure 2F:
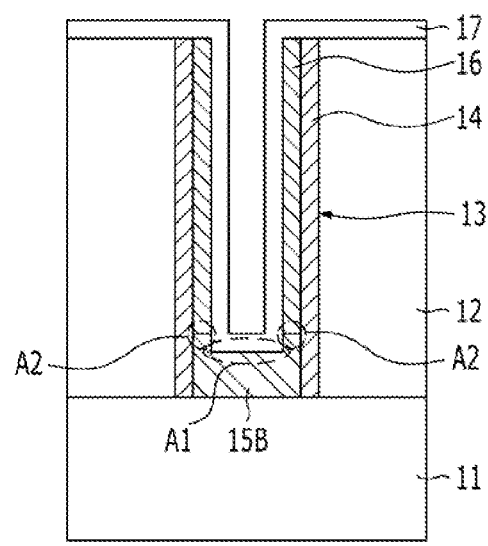

Referring to FIG. 2F, a silicidable layer 17 is formed. The silicidable layer 17 is conformally formed on the entire surface including the sacrificial spacer 16 and the first conductive pattern 15B. The silicidable layer 17 includes a material that forms a metal silicide by a silicidation reaction with the first conductive pattern 155. The silicidable layer 17 includes a silicidable metal layer. The silicidable metal layer may include a metal-containing layer that contains metal atoms such as cobalt. In the case where the first conductive pattern 15B includes polysilicon, the silicidable layer 17 may include cobalt. The silicidable layer 17 may be deposited by PVD.

By forming the silicidable layer 17 as described above, a reaction area for forming a silicide of the silicidable layer 17 and the first conductive pattern 15B is increased. For example, the increased reaction area includes a reaction area A1 by the recessed surface of the first conductive pattern 155 and reaction areas A2 by the projections of the first conductive pattern 15B. This is due to an increase in the line width of the first conductive pattern 155. This will be described later with reference to a comparative example.

While not shown, a protective layer may be formed on the silicidable layer 17. The protective layer is conformally formed on the silicidable layer 17. The protective layer prevents a silicide layer from being attacked in a subsequent silicidation process. The protective layer includes a metal nitride. The protective layer includes a titanium-containing layer. The protective layer may include titanium nitride (TIN). The protective layer may be formed by stacking a titanium (Ti) layer and a titanium nitride (TIN) layer.

Figure 2G:
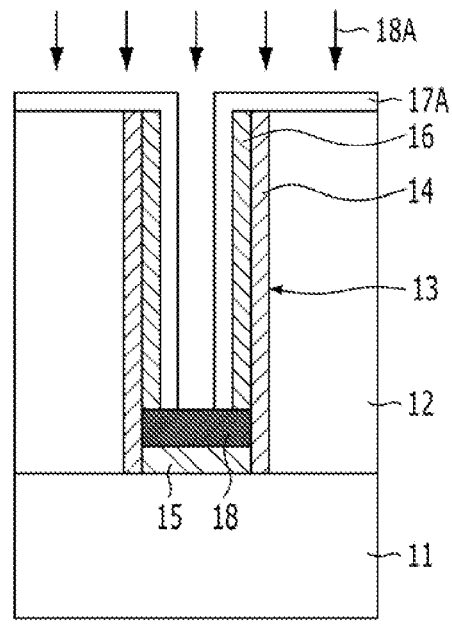

Referring to FIG. 2G, an ohmic contact layer 18 is formed. In order to form the ohmic contact layer 18, annealing 18A may be performed. The ohmic contact layer 18 is formed as the first conductive pattern 155 and the silicidable layer 17 react with each other by the annealing 18A. A silicidation reaction occurs by the annealing 18A. In detail, the silicidation reaction occurs at an interface where the first conductive pattern 15B and the silicidable layer 17 contact each other, by which the ohmic contact layer 18 including a metal silicide layer is formed. The annealing 18A may be performed at a temperature of at least 200° C. to cause the silicidation reaction to occur between the silicidable layer 17 and the first conductive pattern 15B. The annealing 18A includes rapid thermal annealing (RTA). As the silicon atoms of the first conductive pattern 15B and the metal atoms of the silicidable layer 17 react with each other by the annealing 18A, the ohmic contact layer 18 is formed. The ohmic contact layer 18 may include cobalt silicide. In the present embodiment, the ohmic contact layer 18 may include cobalt silicide with the phase of $CoSi_2$. To this end, the annealing 18A may be performed twice. For example, primary annealing is performed at a temperature of 400° C. to 600° C. By the primary annealing, cobalt silicide with the phase of $CoSi_x$ (x=0.1~1.5) is formed. Secondary annealing is performed. The secondary annealing includes rapid thermal annealing (RTA). The secondary annealing may be performed at a temperature higher than the primary annealing. The secondary annealing is performed at a temperature of 600° C. to 800° C. The secondary annealing may be performed after removing the silicidable layer 17A that has not reacted. A phase change occurs in the ohmic contact layer 18 by the secondary annealing. For example, the cobalt silicide with the phase of $CoSi_x$ (x=0.1~1.5) is formed by the primary annealing, and a phase change to cobalt silicide with the phase of $CoSi_2$ occurs by the secondary annealing. Among cobalt silicides, the specific resistance of the cobalt silicide with the phase of $CoSi_2$ is lowest.

After the ohmic contact layer 18 is formed, the silicidable layer 17A that has not reacted may remain. The first conductive pattern 15B may be reduced in its volume as indicated by the reference numeral 15.

When performing the annealing 18A, since the reaction area of silicon, which is involved in the silicidation reaction, is increased by the recessed surface and the projections (see the reference symbols A1 and A2 of FIG. 2F) of the first conductive pattern 15B, it is possible to form cobalt silicide with the phase of $CoSi_2$ having low specific resistance. In the case where the surface of the first conductive pattern 15B is not recessed, the reaction area of silicon, which is involved in the silicidation reaction, may be insufficient, and cobalt silicide with the phase of $Co_2Si$ having high specific resistance may be formed.

By forming the cobalt silicide with the phase of $CoSi_2$ as the ohmic contact layer 18 as described above, contact resistance may be reduced, and at the same time, it is possible to form cobalt silicide with low resistance even in the small area of the opening 13 with a fine line width.

Figure 2H:
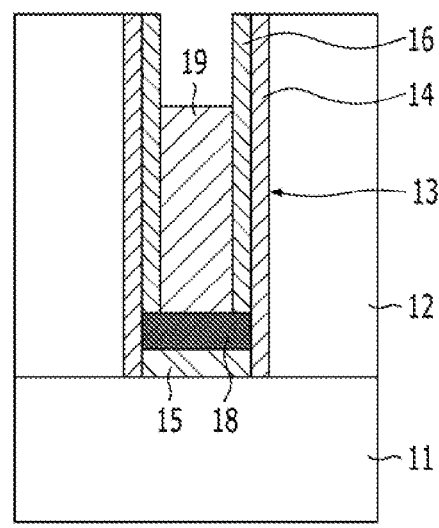

Referring to FIG. 2H, the unreacted silicidable layer 17A is removed.

A second conductive pattern 19 is formed on the ohmic contact layer 18. The second conductive pattern 19 is formed on the ohmic contact layer 18 in such a way as to be recessed in the opening 13. The second conductive pattern 19 may include a metal-containing layer. The second conductive pattern 19 may include a material that contains tungsten. The second conductive pattern 19 may include a tungsten layer or a tungsten compound. The second conductive pattern 19 is formed in such a way as to be recessed to be lower than the surface of the dielectric layer 12. By the second conductive pattern 19, the sacrificial spacer 16 may be partially exposed.

The line width of the second conductive pattern 19 is smaller than that of the first conductive pattern 15. The height of the second conductive pattern 19 is larger than that of the first conductive pattern 15. Accordingly, in a conductive structure to be subsequently formed in the opening 13, the volume of the second conductive pattern 19 is larger than that of the volume of the first conductive pattern 15.

Figure 2I:
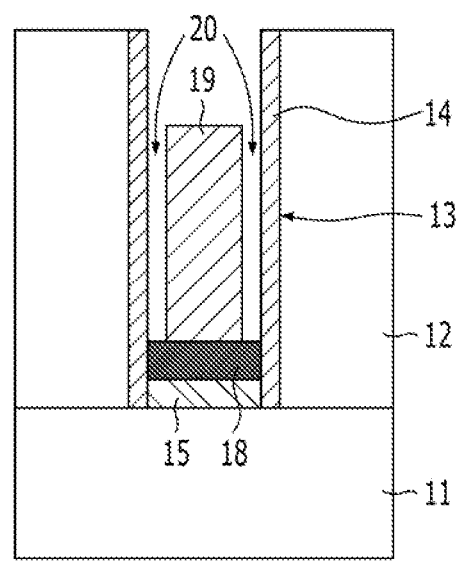

Referring to FIG. 2I, an air gap 20 is formed by removing the sacrificial spacer 16. The air gap 20 is formed between the second conductive pattern 19 and the sidewalls of the opening 13. The sacrificial spacer 16 may be removed by wet etching. In order to remove the sacrificial spacer 16, a cleaning process using a wet type chemical may be performed.

The sacrificial spacer 16 is removed by the above-described sacrificial spacer removing process, and the spaces that have been occupied by the sacrificial spacer 16 become the air gap 20.

The air gap 20 is formed between the second conductive pattern 19 and the sidewalls of the opening 13, and insulation structures constituted by the air gap 20 and the spacer 14 are formed between the second conductive pattern 19 and the sidewalls of the opening 13. The ohmic contact layer 18 is exposed at the bottoms of the air gap 20, whereas the first conductive pattern 15 is not exposed.

Figure 3A:
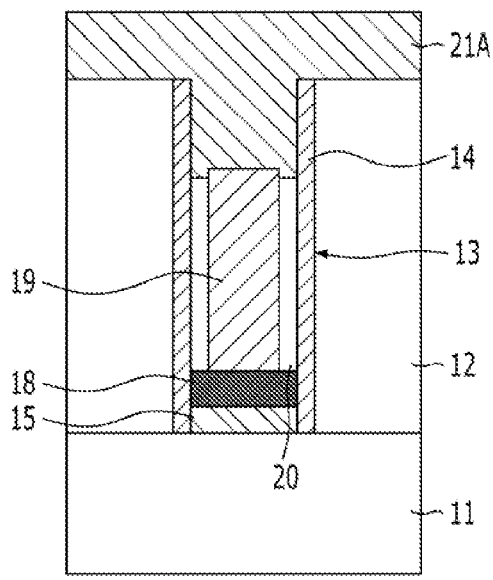
FIGS. 3A and 3B are cross-sectional views showing an exemplary method for capping air gaps in the semiconductor device in accordance with the first embodiment of the present invention.
Figure 3B:
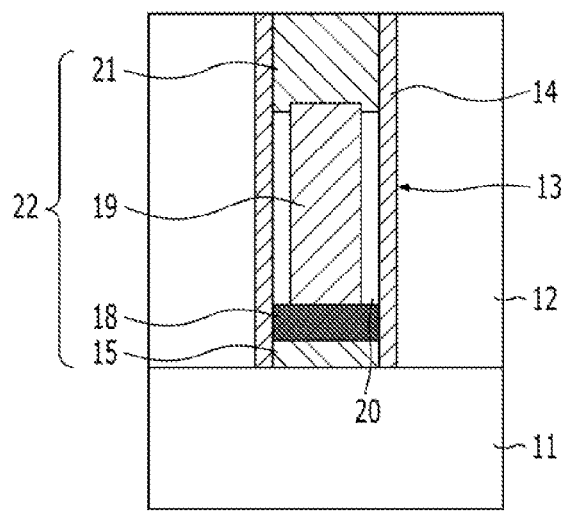

FIGS. 3A and 3B are cross-sectional views showing an exemplary method for capping air gap in the semiconductor device in accordance with the first embodiment of the present invention.

Referring to FIG. 3A, a third conductive layer 21A is formed on the entire surface including the air gap 20 and the second conductive pattern 19. The third conductive layer 21A is formed on the entire surface including the second conductive pattern 19 while capping the air gap 20. Because the spaces of the air gap 20 are narrow, when forming the third conductive layer 21A, capping of the air gap 20 may be implemented while not filling the air gap 20. The third conductive layer 21A gapfills the remaining portion of the opening 13 on the second conductive pattern 19. The third conductive layer 21A may include a metal-containing layer. The third conductive layer 21A may include a tungsten layer.

Referring to FIG. 3B, the third conductive layer 21A is planarized. In order for planarization, an etch-back process or a CMP (chemical mechanical polishing) process may be applied.

By performing planarization as described above, a third conductive pattern 21 is formed. Therefore, a conductive structure 22 formed in the opening 13 includes the first conductive pattern 15, the ohmic contact layer 18, the second conductive pattern 19, and the third conductive pattern 21. The ohmic contact layer 18 forms an ohmic contact between the first conductive pattern 15 and the second conductive pattern 19. The air gap 20 is formed between the second conductive pattern 19 and the sidewalls of the opening 13. Insulation structures including the air gap 20 and the spacer 14 are formed between the conductive structure 22 and the sidewalls of the opening 13. By forming the third conductive pattern 21, it is possible to protect the air gap 20 from a subsequent etching process that is to be performed on the conductive structure 22. The third conductive pattern 21 serves as a capping structure that protects the air gap 20.

Figure 4A:
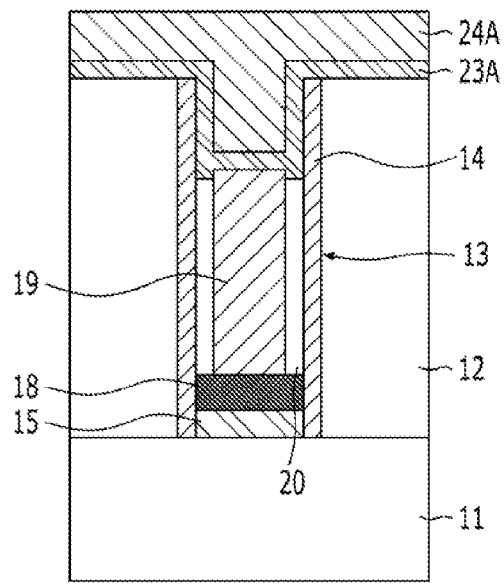
FIGS. 4A and 4B are cross-sectional views showing another exemplary method for capping air gaps in the semiconductor device in accordance with the first embodiment of the present invention.
Figure 4B:
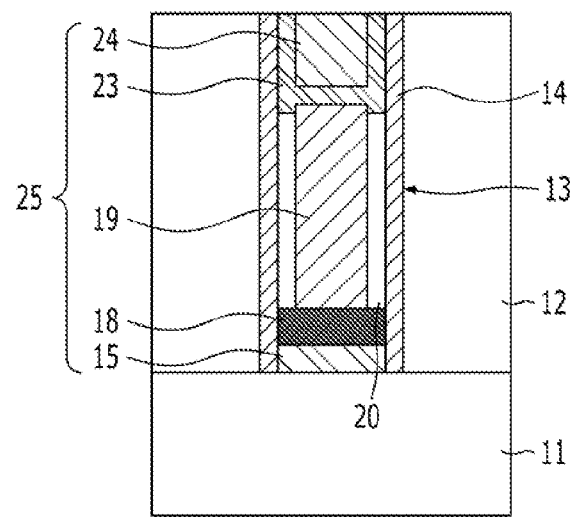

FIGS. 4A and 4B are cross-sectional views showing another exemplary method for capping air gap in the semiconductor device in accordance with the first embodiment of the present invention.

Referring to FIG. 4A, a barrier layer 23A is formed on the entire surface including the air gap 20 and the second conductive pattern 19. The barrier layer 23A includes a conductive material. The barrier layer 23A caps the air gap 20. When forming the barrier layer 23A, a thickness is controlled not to fill the air gap 20 but to cap the air gap 20. The barrier layer 23A includes a titanium-containing layer. The barrier layer 23A may include titanium nitride (TiN). The barrier layer 23A is formed by CVD or PVD.

By forming the barrier layer 23A as described above, it is possible to cap the air gap 20 while forming a barrier layer between the second conductive pattern 19 and a third conductive pattern that is to be subsequently formed.

A third conductive layer 24A is formed. The third conductive layer 24A gapfills the remaining portion of the opening 13 on the barrier layer 23A. The third conductive layer 24A may include a metal-containing layer. The third conductive layer 24A may include a tungsten layer.

Referring to FIG. 4B, the barrier layer 23A and the third conductive layer 24A are planarized. In order for planarization an etch-back process or a CMP process may be applied.

By performing planarization as described above, a barrier pattern 23 and a third conductive pattern 24 is formed. Therefore, a conductive structure 25 formed in the opening 13 includes the first conductive pattern 15, the ohmic contact layer 18, the second conductive pattern 19, the barrier pattern 23, and the third conductive pattern 24. The ohmic contact layer 18 forms an ohmic contact between the first conductive pattern 15 and the second conductive pattern 19. The barrier pattern 23 prevents interdiffusion between the second conductive pattern 19 and the third conductive pattern 24.

The air gap 20 is formed between the second conductive pattern 19 and the sidewalls of the opening 13. Insulation structures including the air gap 20 and the spacer 14 are formed between the conductive structure 25 and the sidewalls of the opening 13.

By forming the barrier pattern 23 and the third conductive pattern 24, it is possible to protect the air gap 20 from a subsequent etching process that is to be performed on the conductive structure 25. The barrier pattern 23 and the third conductive pattern 24 serve as a capping structure that protects the air gap 20.

The conductive structures 22 and 25 formed by the above-described capping methods may be a contact plug, an electrode, etc. In the case of a contact plug, the first conductive pattern 15 may be a plug pad, and the second conductive pattern 19 may be a main plug. The third conductive patterns 21 and 24 and the barrier pattern 23 may be a capping structure that caps the air gap 20. Since the second conductive pattern 19 as a main plug includes a metal-containing layer, the resistance of the contact plug is reduced. That is to say, by minimizing the volume of the first conductive pattern 15 as a silicon-containing layer and maximizing the volume of the second conductive pattern 19 as a metal-containing layer, the resistance of the contact plug may be reduced. Furthermore, since the ohmic contact layer 18 is included, resistance is further reduced, and since the area of the ohmic contact layer 18 is large, interfacial resistance is reduced.

The conductive structures 22 and 25 may be a bit line, a metal line, a gate electrode, a word line, or the like.

According to the above-described embodiments, by defining the air gap 20, the electrical insulation characteristic of the conductive structures 22 and 25 is improved. For instance, in the case where another conductive pattern is positioned adjacent to the second to conductive pattern 19, the parasitic capacitance between the two conductive patterns is reduced.

Further, since the air gap 20 are formed after forming the ohmic contact layer 18, an area over that the ohmic contact layer 18 is to be formed may be increased. According to this fact, contact resistance may be reduced.

Figure 5A:
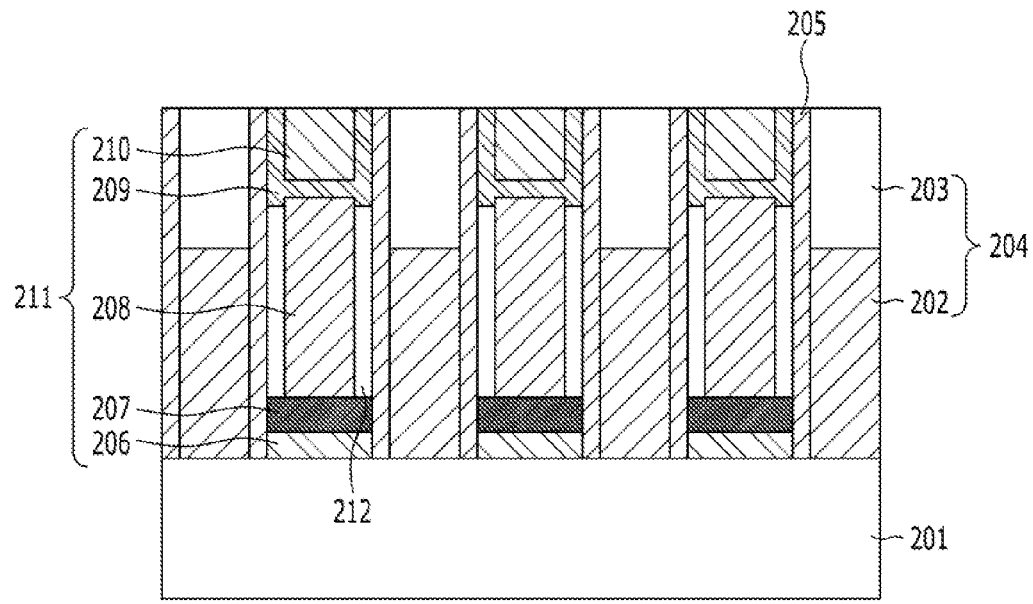
FIG. 5A is a cross-sectional view illustrating a semiconductor device in accordance with a second embodiment of the present invention.

FIG. 5A is a cross-sectional view illustrating a semiconductor device in accordance with a second embodiment of the present invention.

Referring to FIG. 5A, a plurality of conductive structures are formed on a substrate 201. The conductive structures include first conductive structures 204 and second conductive structures 211. Insulation structures with air gaps 212 are formed between the first conductive structures 204 and the second conductive structures 211. Spacers 205 are formed on the sidewalls of the first conductive structures 204. The air gaps 212 are formed between the spacers 205 and the second conductive structures 211. Each of the first conductive structures 204 includes a first conductive pattern 202 and a dielectric pattern 203. Each of the second conductive structures 211 includes a second conductive pattern 206, an ohmic contact layer 207, a third conductive pattern 208, a barrier pattern 209, and a fourth conductive pattern 210. The air gaps 212 and the third conductive pattern 208 are capped by the barrier pattern 109.

Detailed descriptions will be given below.

The substrate 201 may include a silicon substrate or a silicon germanium substrate. Also, the substrate 201 may include an SDI substrate.

The first conductive structure 204 includes the first conductive pattern 202. The first conductive structure 204 may be a stack structure that includes the first conductive pattern 202 and the dielectric pattern 203. The first conductive pattern 202 may include a silicon-containing layer or a metal-containing layer. The first conductive pattern 202 may include a silicon-containing layer and a metal-containing layer, which are stacked. The first conductive pattern 202 may include polysilicon, a metal, a metal nitride, a metal silicide, or the like. The first conductive pattern 202 may include a polysilicon layer and a metal layer, which are stacked. The metal layer may include tungsten. The dielectric pattern 203 includes a dielectric material. The dielectric pattern 203 may include an oxide or a nitride. The dielectric pattern 203 may be a hard mask pattern. Each of the first conductive structure 204 and the second conductive structure 211 has a line shape or a pillar shape. Also, any one conductive structure of the first conductive structure 204 and the second conductive structure 211 may have a line shape that extends in any one direction. The other conductive structure may have a pillar shape. For instance, the first conductive structure 204 may be a line type structure, and the second conductive structure 211 may be a pillar type structure. The first conductive structures 204 are spaced at regular intervals on the substrate 201. Any one of the first conductive structure 204 and the second conductive structure 211 may include a gate structure or a bit line structure, and the other may include a contact plug. The contact plug may include a storage node contact plug, a landing plug or a metal contact plug. For example, the second conductive structure 211 may be a contact plug, and the contact plug may be a stack structure that includes a silicon plug, an ohmic contact layer and a metal plug.

Each of the second conductive structures 211 includes a second conductive pattern 206 that is formed between adjacent first conductive structures 204 in such a way as to be recessed. The second conductive structure 211 may be a stack structure that includes the second conductive pattern 206, an ohmic contact layer 207, a third conductive pattern 208, a barrier pattern 209 and a fourth conductive pattern 210. The second conductive pattern 206 may include a silicon-containing layer. The second conductive pattern 206 may include a polysilicon layer. Each of the third conductive pattern 208 and the fourth conductive pattern 210 may include a metal-containing layer. Each of the third conductive pattern 208 and the fourth conductive pattern 210 may include a metal, a metal silicide, a metal nitride, or the like. The ohmic contact layer 207 is formed between the second conductive pattern 206 and the third conductive pattern 208. The ohmic contact layer 207 includes a metal silicide. The metal silicide includes cobalt silicide. The cobalt silicide includes cobalt silicide with the phase of $CoSi_2$. The second conductive pattern 206 has a surface that is recessed to have a height lower than the upper surface of the first conductive pattern 202. The third conductive pattern 208 has a line width smaller than that of the second conductive pattern 206 and a height larger than that of the second conductive pattern 206. According to this fact the volume of the third conductive pattern 208 is larger than that of the second conductive pattern 206. Openings (not numbered) may be formed between adjacent first conductive structures 204, and the second conductive structures 211 may be formed in the openings. Each of the openings may have a shape that opens the opposing sidewalls of adjacent first conductive structures 204.

Each of the barrier patterns 209 covers the upper surface and the sidewall portions of the third conductive pattern 208 and caps the air gaps 212. Furthermore, the barrier pattern 209 covers the sidewall portions of the opening 103 on the air gaps 212. The barrier patterns 209 include a titanium-containing layer. The barrier patterns 209 include titanium nitride.

The spacers 205 are formed on the sidewalls of the first conductive structures 204. The spacers 205 include a low-k material. The low-k material includes an oxide or a nitride. The spacers 205 may include silicon oxide, silicon nitride or a metal oxide.

The air gaps 212 may be formed as a sacrificial material formed between the third conductive patterns 208 and the spacers 205 is removed. This will be described later.

In FIG. 5A, the air gaps 212 are stably capped by the barrier patterns 209. By defining the air gaps 212, the parasitic capacitance between the first conductive structures 204 and the second conductive structures 211 is reduced.

The air gaps 212 may be formed after the ohmic contact layer 207 and the third conductive patterns 208 are formed on the second conductive patterns 206. Due to this fact, a wide area for forming the ohmic contact layer 207 may be secured. By minimizing the volume of the second conductive pattern 206 as a silicon-containing layer and maximizing the volume of the third conductive pattern 208 as a metal-containing layer, the resistance of the second conductive structure 211 may be reduced. Furthermore, since the ohmic contact layer 207 is included, resistance is further reduced, and since the area of the ohmic contact layer 207 is large, interfacial resistance is reduced.

Figure 5B:
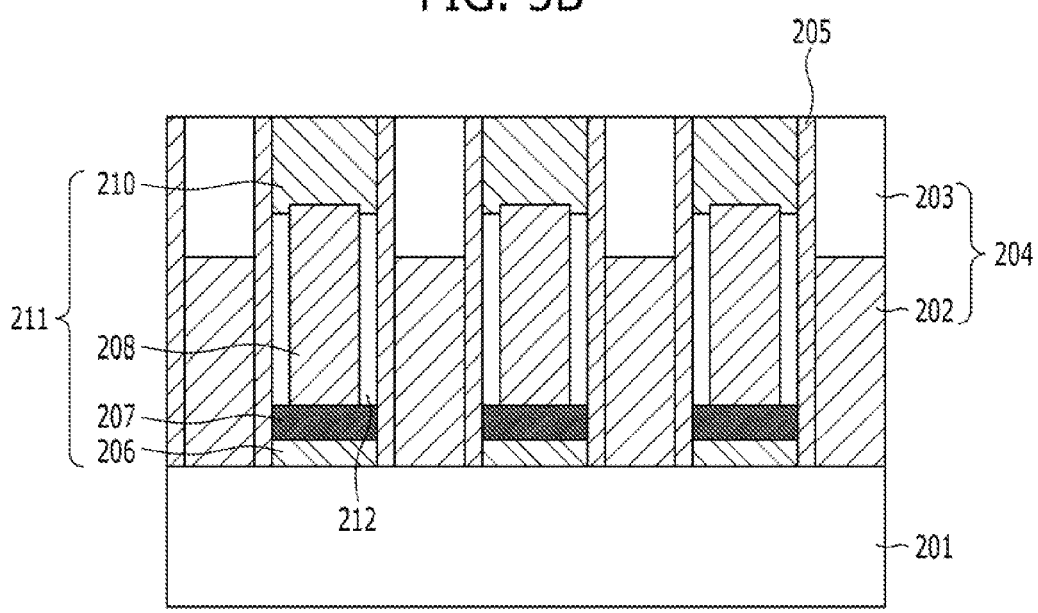
FIG. 5B is a cross-sectional view illustrating a semiconductor device in accordance with a variation of the second embodiment of the present invention.

FIG. 5B is a cross-sectional view illustrating a semiconductor device in accordance with a variation of the second embodiment of the present invention.

Referring to FIG. 5B, unlike FIG. 5A, the air gaps 212 and the third conductive patterns 208 are capped using the fourth conductive patterns 210 without using barrier patterns.

FIGS. 6A to 6H are cross-sectional views showing an exemplary method for fabricating the semiconductor device in accordance with the second embodiment of the present invention.

Figure 6A:
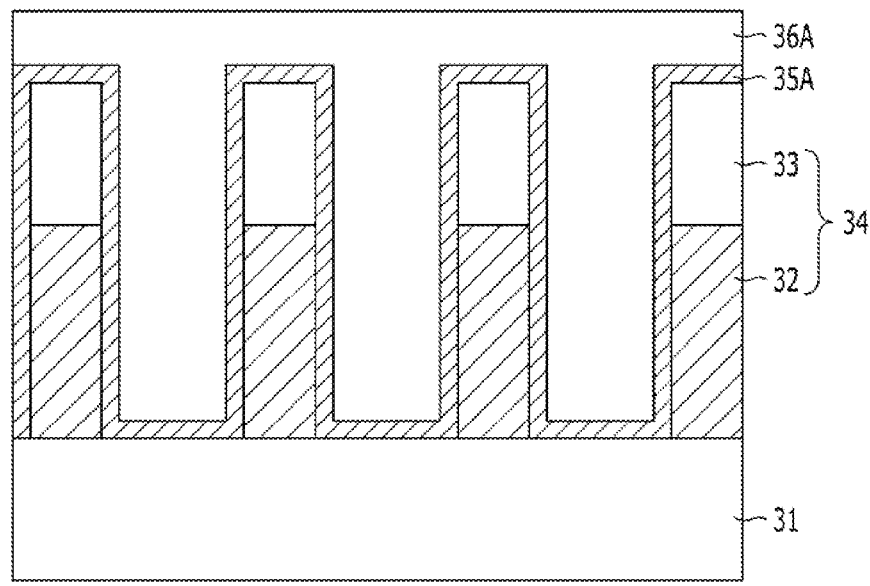
FIGS. 6A to 6H are cross-sectional views showing an exemplary method for fabricating the semiconductor device in accordance with the second embodiment of the present invention.

Referring to FIG. 6A, a plurality of first conductive structures 34 are formed on a substrate 31. The substrate 31 includes a semiconductor substrate. The substrate 31 contains silicon. The substrate 31 may include a silicon substrate or a silicon germanium substrate. Also, the substrate 31 may include an SOI substrate.

The first conductive structures 34 that are formed on the substrate 31 are spaced at regular intervals. In order to form the first conductive structures 34, hard mask patterns 33 are formed on a first conductive layer (not shown). By etching the first conductive layer using the hard mask patterns 33 as an etch mask, first conductive patterns 32 are formed. Consequently, the first conductive structures 34, in which the first conductive patterns 32 and the hard mask patterns 33 are stacked, are formed. The first conductive patterns 32 include a silicon-containing layer or a metal-containing layer. For example, the first conductive patterns 32 may include polysilicon or tungsten. Further, the first conductive patterns 32 may be formed by stacking a silicon-containing layer and a metal-containing layer. For instance, the first conductive patterns 32 may be formed by stacking a polysilicon layer and a tungsten layer. A barrier layer may be additionally formed between the polysilicon layer and the tungsten layer. The first conductive patterns 32 may include a stack structure of a polysilicon layer, a titanium-containing layer and a tungsten layer. As the titanium-containing layer being the barrier layer, a titanium (Ti) layer and a titanium nitride (TIN) layer may be stacked. The hard mask patterns 33 are formed using a dielectric material.

A first dielectric layer 35A is formed on the plurality of first conductive structures 34. The first dielectric layer 35A includes a low-k material. The first dielectric layer 35A includes a nitride or an oxide. For instance, the first dielectric layer 35A may include silicon nitride or silicon oxide. The first dielectric layer 35A is conformally formed on the entire surface including the first conductive structures 34. The first dielectric layer 35A is a material that will become spacers.

A second dielectric layer 36A is formed on the first dielectric layer 35A. The second dielectric layer 36A may include a silicon oxide. The second dielectric layer 36A may be formed on the first dielectric layer 35A in such a way as to fill the spaces between the first conductive structures 34. The second dielectric layer 36A becomes an interlayer dielectric layer.

Figure 6B:
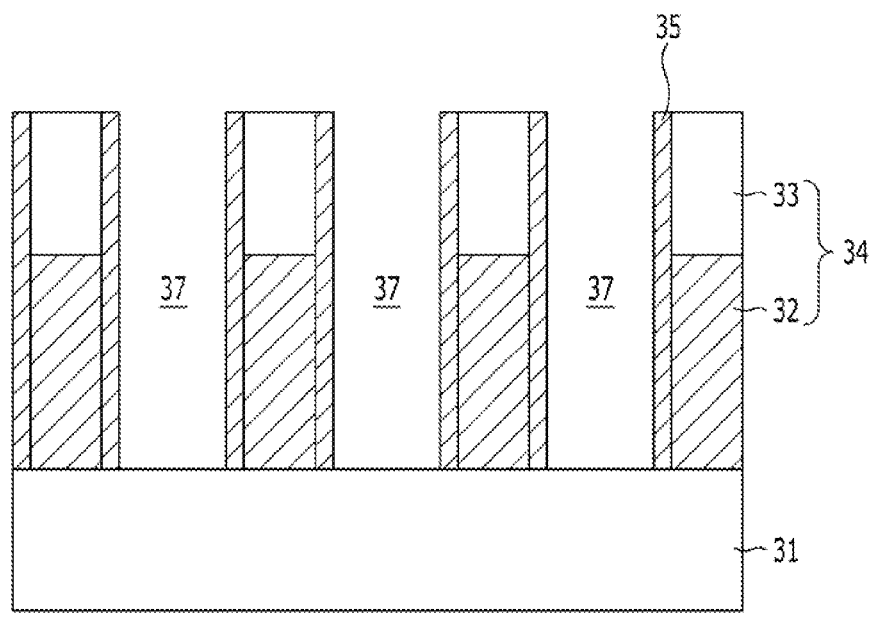

Referring to FIG. 6B, the second dielectric layer 36A is planarized. Planarization may be implemented such that the surface of the first dielectric layer 35A on the first conductive structures 34 is exposed.

Openings 37 are formed by etching the second dielectric layer 36A. After the openings 37 are formed, the second dielectric layer 36A may not be shown. In order to define the openings 37, to mask patterns (not shown) may be used. Each of the openings 37 may have a hole shape or a line shape. The openings 37 may be formed between the first conductive structures 34. The first dielectric layer 35A may be exposed on the sidewalls of the openings 37. In order to define the openings 37, the second dielectric layer 36A may be etched by being aligned with the first conductive structures 34 and the first dielectric layer 35A.

The first dielectric layer 35A may remain on the substrate 31 on the bottoms of the openings 37.

The surface of the substrate 31 is exposed by etching the first dielectric layer 35A. By etching the first dielectric layer 35A in this way, spacers 35 are formed on the sidewalls of the first conductive structures 34.

In another embodiment, the spacers 35 are formed after defining the openings 37. In other words, the first dielectric layer 35A is formed after defining the openings 37, and then, the spacers 35 are formed by etching the first dielectric layer 35A.

Figure 6C:
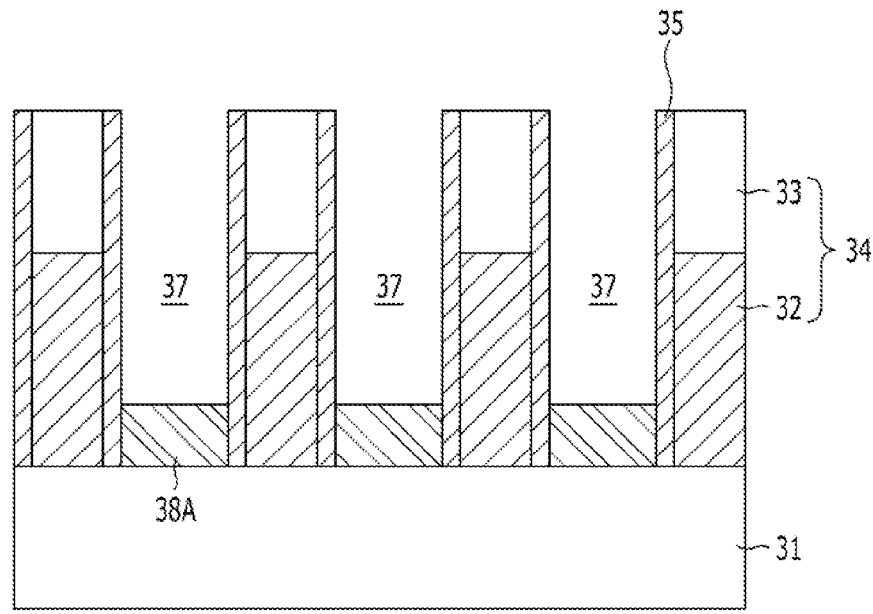

Referring to FIG. 6C, second conductive patterns 38A are formed. A second conductive layer (not shown) is formed on the entire surface including the spacers 35 to fill the openings 37. The second conductive layer is etched by an etch-back process. According to this fact, the second conductive patterns 38A are formed in such a way as to be recessed in the openings 37. The second conductive patterns 38A have surfaces that are recessed to be lower than the upper surfaces of the first conductive structures 34. The second conductive patterns 38A include a silicidable material. The second conductive patterns 38A may include a silicon-containing layer. The second conductive patterns 38A may include polysilicon. The polysilicon may be doped with impurities. The second conductive patterns 38A contact the surface of the substrate 31. The height of the second conductive pattern 38A may be controlled as low as possible. This is to minimize a volume that is occupied by the second conductive pattern 38A in a second conductive structure that will be subsequently formed.

Figure 6D:
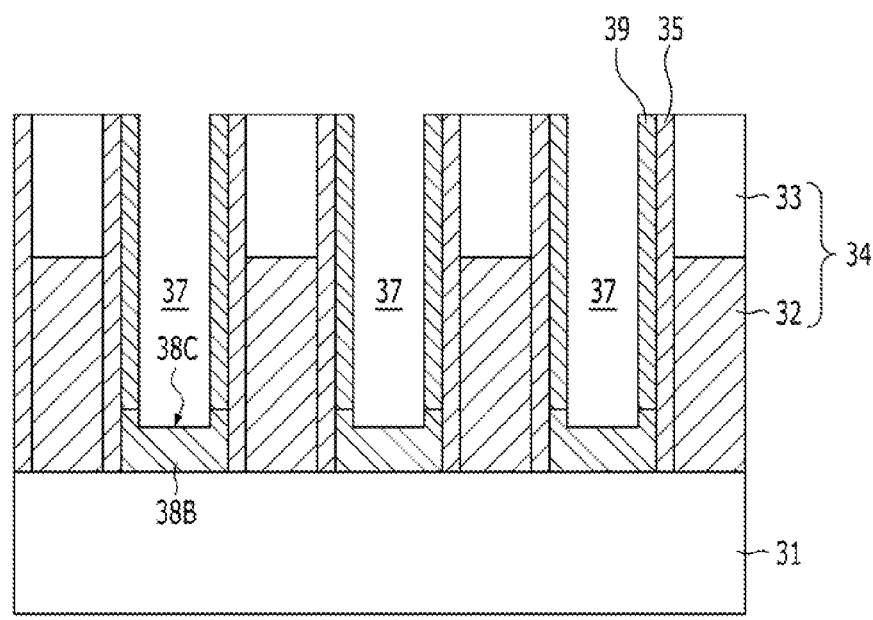

Referring to FIG. 6D, sacrificial spacers 39 are formed. The sacrificial spacers 39 are formed on the sidewalls of the openings 37 on the second conductive patterns 38A. The sacrificial spacers 39 may be formed by selectively etching a sacrificial layer (not shown). In order to form the sacrificial spacers 39, a dry etching process may be applied. For instance, the dry etching process may include an etch-back process. By the sacrificial spacers 39, the upper surfaces of the second conductive patterns 38A are exposed. The sacrificial spacers 39 may include a material that is to be removed in a subsequent process to define air gaps. The sacrificial spacers 39 may include a dielectric material. The sacrificial spacers 39 may include silicon oxide or silicon nitride. The sacrificial spacers 39 may be formed by stacking silicon oxide and silicon nitride.

When forming the sacrificial spacers 39 or after forming the sacrificial spacers 39, the surfaces of the second conductive patterns 38A may be recessed by a predetermined depth (see the reference numeral 38C). The second conductive patterns 38A recessed in this way have shapes as indicated by the reference numeral 38B. This is to increase a reaction area for subsequently forming a silicide layer.

Figure 6E:
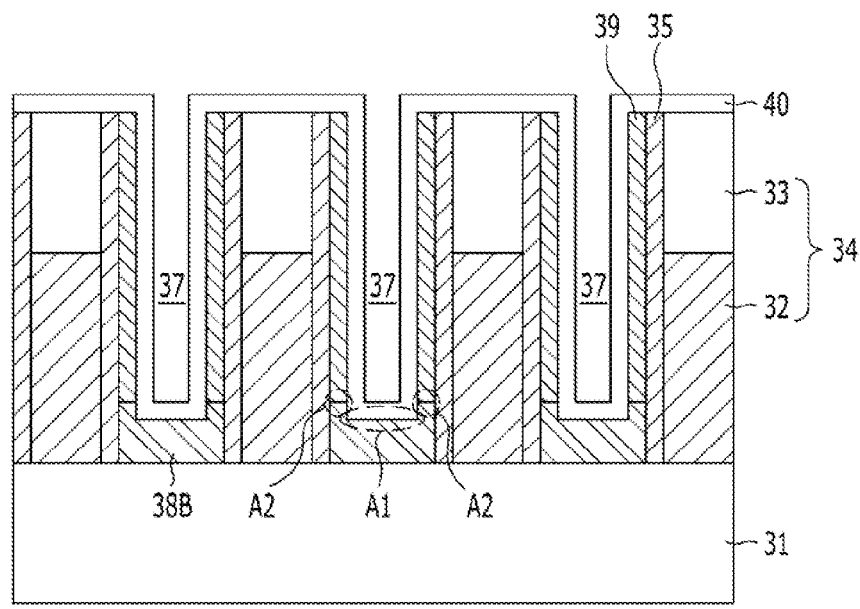

Referring to FIG. 6E a silicidable layer 40 is formed. The silicidable layer 40 is conformally formed on the entire surface including the sacrificial spacers 39 and the second conductive patterns 38B. The silicidable layer 40 includes a material that forms a metal silicide by a silicidation reaction with the second conductive patterns 38B. The silicidable layer 40 includes a silicidable metal layer. The silicidable metal layer may include a metal-containing layer that contains metal atoms such as cobalt. In the case where the second conductive patterns 38B include polysilicon, the silicidable layer 40 may include cobalt. The silicidable layer 40 may be deposited by PVD.

By forming the silicidable layer 40 as described above, a reaction area for forming a silicide of the silicidable layer 40 and the second conductive patterns 38B is increased. For example, the increased reaction area includes a reaction area A1 by the recessed surface of each second conductive pattern 38B and reaction areas A2 by the projections of each second conductive pattern 38B. This is due to an increase in the line width of the second conductive pattern 38B. This will be described later with reference to a comparative example.

While not shown, a protective layer may be formed on the silicidable layer 40. The protective layer is conformally formed on the silicidable layer 40. The protective layer prevents a silicide layer from being attacked in a subsequent silicidation process. The protective layer includes a metal nitride. The protective layer includes a titanium-containing layer. The protective layer may include titanium nitride (TIN). The protective layer may be formed by stacking a titanium (Ti) layer and a titanium nitride (TiN) layer.

Figure 6F:
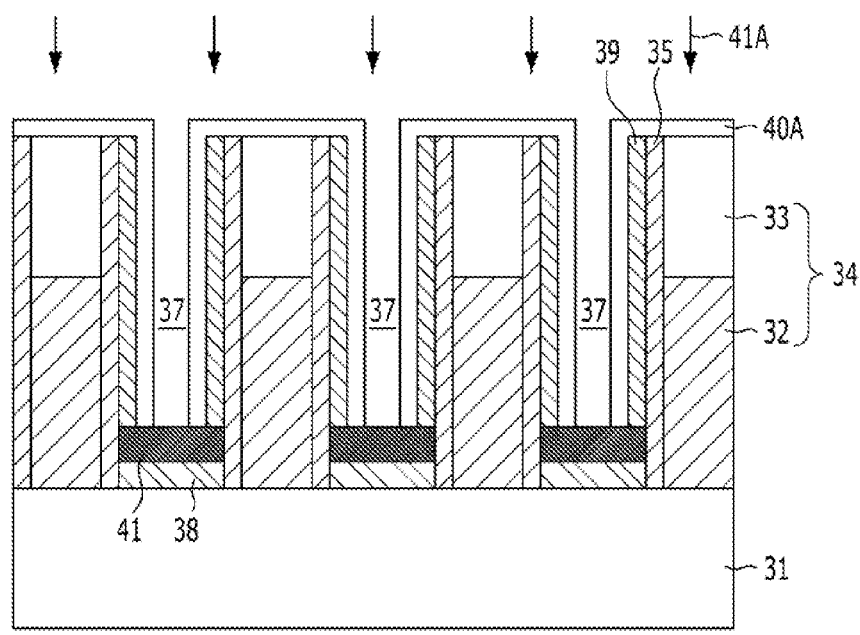

Referring to FIG. 6F, an ohmic contact layer 41 is formed. In order to form the ohmic contact layer 41, annealing 41A may be performed. The ohmic contact layer 41 is formed as the second conductive patterns 38B and the silicidable layer 40 react with each other by the annealing 41A. A silicidation reaction occurs by the annealing 41A. In detail, the silicidation reaction occurs at an interface where the second conductive patterns 38B and the silicidable layer 40 contact each other, by which the ohmic contact layer 41 including a metal silicide layer is formed. The annealing 41A may be performed at a temperature of at least 200° C. to cause the silicidation reaction to occur between the silicidable layer 40 and the second conductive patterns 38B. The annealing 41A includes rapid thermal annealing (RTA). As the silicon atoms of the second conductive patterns 38B and the metal atoms of the silicidable layer 40 react with each other by the annealing 41A, the ohmic contact layer 41 is formed. The ohmic contact layer 41 may include cobalt silicide. In the present embodiment, the ohmic contact layer 41 may include cobalt silicide with the phase of $CoSi_2$. To this end, the annealing 41A may be performed twice. For example, primary annealing is performed at a temperature of 400° C. to 600° C. By the primary annealing, cobalt silicide with the phase of $CoSi_x$ ($x=0.1\sim1.5$) is formed. Secondary annealing is performed. The secondary annealing includes rapid thermal annealing (RTA). The secondary annealing may be performed at a temperature higher than the primary annealing. The secondary annealing is performed at a temperature of 600° C. to 800° C. A phase change occurs in the ohmic contact layer 41 by the secondary annealing. For example, the cobalt silicide with the phase of $CoSi_x$ ($x=0.1\sim1.5$) is formed by the primary annealing, and a phase change to cobalt silicide with the phase of $CoSi_2$ occurs by the secondary annealing. Among cobalt silicides, the specific resistance of the cobalt silicide with the phase of $CoSi_2$ is lowest.

After the ohmic contact layer 41 is formed, the silicidable layer 40A that has not reacted may remain. Each of the second conductive patterns 38B may be reduced in its volume as indicated by the reference numeral 38.

When performing the annealing 41A, since the reaction area of silicon that is involved in the silicidation reaction is increased by the recessed surface and the projections (see the reference symbols A1 and A2 of FIG. 6E) of each second conductive pattern 38B, it is possible to form cobalt silicide with the phase of $CoSi_2$ having low specific resistance. In the case where the surface of each second conductive pattern 38B is not recessed, the reaction area of silicon that is involved in the silicidation reaction may be insufficient, and cobalt silicide with the phase of $Co_2Si$ having high specific resistance may be formed.

By forming the cobalt silicide with the phase of $CoSi_2$ as the ohmic contact layer 41 as described above, contact resistance may be reduced, and at the same time, it is possible to form cobalt silicide with low resistance even in the small area of each opening 37 with a fine line width.

Figure 6G:
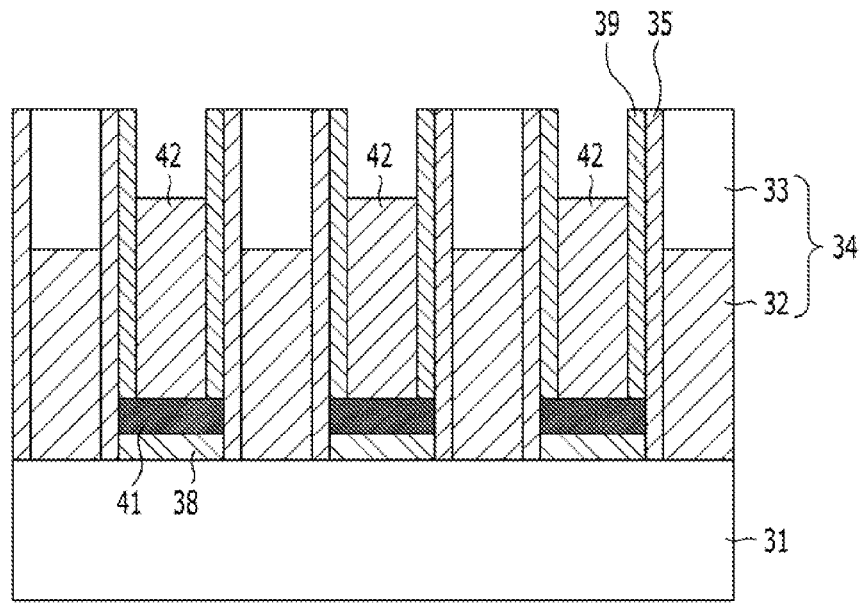

Referring to FIG. 6G, the unreacted silicidable layer 40A is removed.

Third conductive patterns 42 are formed on the ohmic contact layer 41. The third conductive patterns 42 are formed on the ohmic contact layer 41 in such a way as to be recessed in the openings 37. The third conductive patterns 42 may include a metal-containing layer. The third conductive patterns 42 may include a material that contains tungsten. The third conductive patterns 42 may include a tungsten layer or a tungsten compound. The third conductive patterns 42 are formed in such a way as to be recessed to be lower than the surfaces of the first conductive structures 34. By the third conductive patterns 42, the sacrificial spacers 39 may be partially exposed.

The height of each third conductive pattern 42 is larger than that of each second conductive pattern 38, and the line width of each third conductive pattern 42 is smaller than that of each second conductive pattern 38. Accordingly, the volume of the third conductive pattern 42 is larger than the volume of the second conductive pattern 38.

Figure 6H:
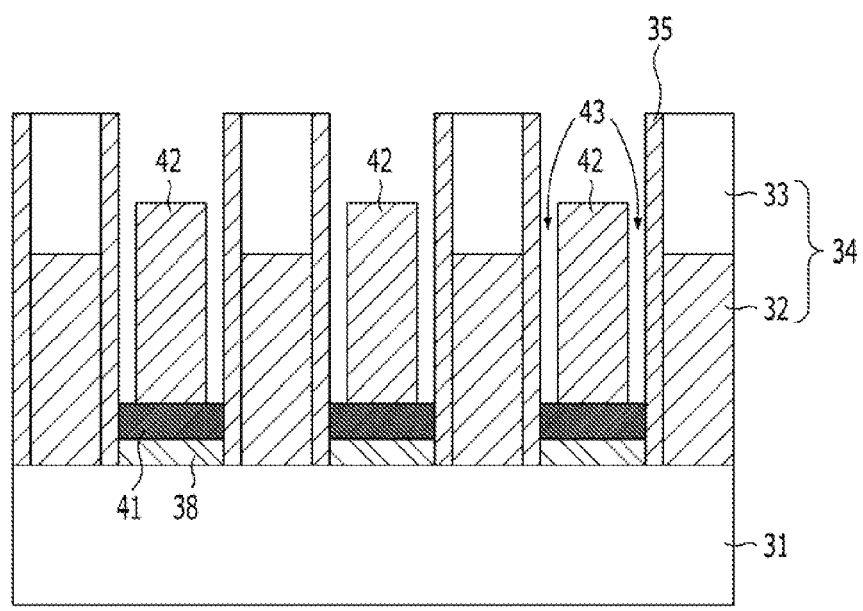

Referring to FIG. 6H, air gaps 43 are formed by removing the sacrificial spacers 39. The air gaps 43 are formed between the third conductive patterns 42 and the sidewalls of the first conductive structures 34. The sacrificial spacers 39 may be removed by wet etching. In order to remove the sacrificial spacers 39, a cleaning process using a wet type chemical may be performed.

The sacrificial spacers 39 are removed by the above-described sacrificial spacer removing process, and the spaces that have been occupied by the sacrificial spacers 39 become the air gaps 43.

The air gaps 43 are formed between the third conductive patterns 42 and the sidewalls of the first conductive structures 34, and insulation structures constituted by the air gaps 43 and the spacers 35 are formed between the third conductive patterns 42 and the sidewalls of the first conductive structures 34. The ohmic contact layer 41 is exposed at the bottoms of the air gaps 43, whereas the second conductive patterns 38 are not exposed.

Figure 7:
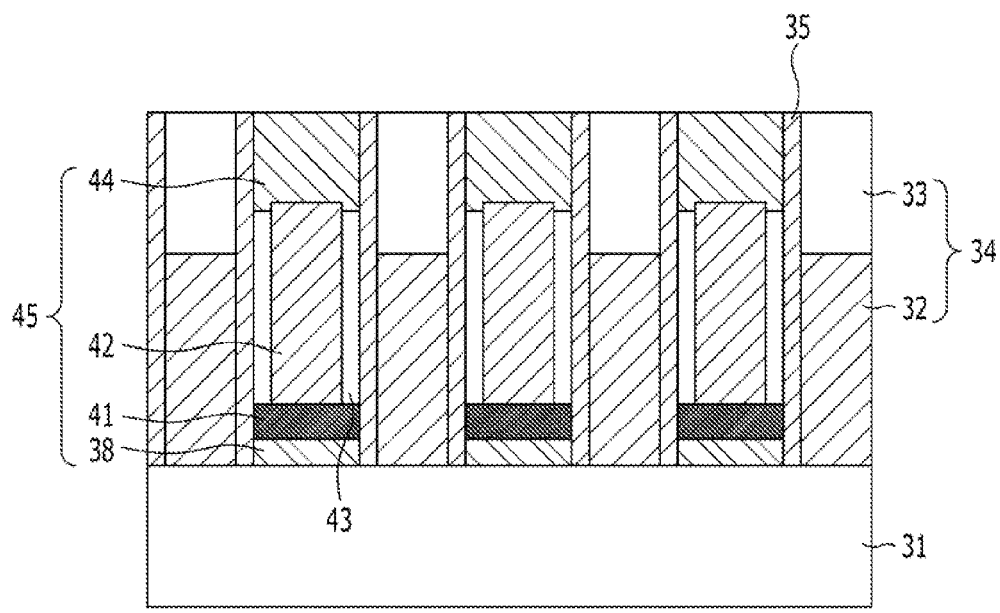
FIG. 7 is a cross-sectional view showing an exemplary method for capping air gaps in the semiconductor device in accordance with the second embodiment of the present invention.

FIG. 7 is a cross-sectional view showing an exemplary method for capping air gaps in the semiconductor device in accordance with the second embodiment of the present invention.

Referring to FIG. 7, fourth conductive patterns 44 are formed on the air gaps 43 and the third conductive patterns 42. The fourth conductive patterns 44 cap the air gaps 43 and gapfill parts on the third conductive patterns 42. Because the spaces of the air gaps 43 are narrow, when forming the fourth conductive patterns 44, capping of the air gaps 43 may be implemented while not filling the air gaps 43. Portions of the fourth conductive patterns 44 may cover the sidewalls of the third conductive patterns 42. The fourth conductive patterns 44 may include a metal-containing layer. The fourth conductive patterns 44 may include a tungsten layer. In order to form the fourth conductive patterns 44, a fourth conductive layer (not shown) is gapfilled and is then planarized. In order for planarization, an etch-back process or a CMP process may be applied.

By forming the fourth conductive patterns 44 as described above, second conductive structures 45 are formed. Each of the second conductive structures 45 includes the second conductive pattern 38, the ohmic contact layer 41, the third conductive pattern 42, and the fourth conductive pattern 44. The ohmic contact layer 41 forms an ohmic contact between each second conductive pattern 38 and each third conductive pattern 42. The air gaps 43 are formed on the sidewalls of the third conductive patterns 42. Insulation structures including the air gaps 43 and the spacers 35 are formed between the first conductive structures 34 and the second conductive structures 45. By forming the fourth conductive patterns 44, it is possible to protect the air gaps 43 from a subsequent etching process that is to be performed on the second conductive structures 45. The fourth conductive patterns 44 serve as capping structures that protect the air gaps 43.

Figure 8:
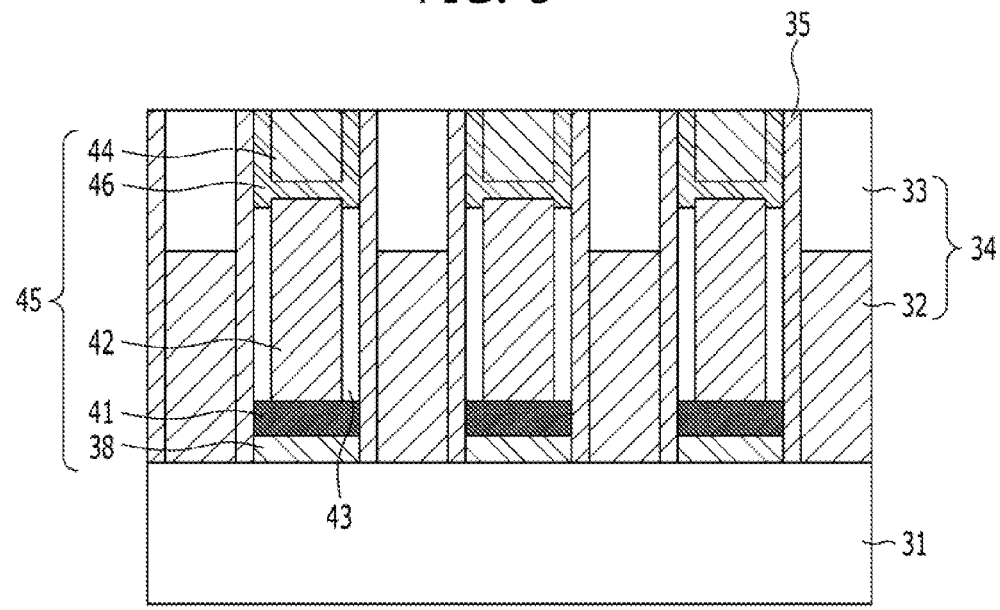
FIG. 8 is a cross-sectional view showing another exemplary method for capping air gaps in the semiconductor device in accordance with the second embodiment of the present invention.

FIG. 8 is a cross-sectional view showing another exemplary method for capping air gaps in the semiconductor device in accordance with the second embodiment of the present invention.

Referring to FIG. 8, barrier patterns 46 and fourth conductive patterns 44 are formed on the third conductive patterns 42. As a consequence, second conductive structures 45 are formed. Each of second conductive structures 45 includes the second conductive pattern 38, the ohmic contact layer 41, the third conductive pattern 42, the barrier pattern 46, and the fourth conductive pattern 44. The ohmic contact layer 41 forms an ohmic contact between each second conductive pattern 38 and each third conductive pattern 42. The barrier patterns 46 prevent interdiffusion between the third conductive patterns 42 and the fourth conductive patterns 44.

The air gaps 43 are formed on the sidewalls of the third conductive patterns 42. Insulation structures including the air gaps 43 and the spacers 35 are formed between the first conductive structures 34 and the second conductive structures 45. By forming the barrier patterns 46 and the fourth conductive patterns 44, it is possible to protect the air gaps 43 from a subsequent etching process that is to be performed on the second conductive structures 45. The barrier patterns 46 and the fourth conductive patterns 44 serve as capping structures that protect the air gaps 43.

The second conductive structures 45 formed according to the above-described air gap capping methods may be contact plugs, electrodes, or the likes. In the case of contact plugs, the second conductive patterns 38 may be plug pads and the third conductive patterns 42 may be main plugs. The fourth conductive patterns 44 and the barrier patterns 46 may be capping structures that cap the air gaps 43. Since each of the third conductive patterns 42 as main plugs includes a metal-containing layer, the resistance of each of the contact plugs is reduced. That is to say, by minimizing the volume of each of the second conductive patterns 38 as a silicon-containing layer and maximizing the volume of each of the third conductive patterns 42 as a metal-containing layer, the resistance of each of the contact plugs may be reduced. Furthermore, since the ohmic contact layer 41 is included, resistance is further reduced, and since the area of the ohmic contact layer 41 is large, interfacial resistance is reduced.

Further, the second conductive structures 45 may be bit lines, metal lines, gate electrodes, word lines, or the likes.

According to the above-described embodiments, by defining the air gaps 43, the parasitic capacitance between the first conductive structures 34 and the second conductive structures 45 may be reduced.

Moreover, by maximizing the volume of each of the third conductive patterns 42, the resistance of each of the second conductive structures 45 may be reduced. Furthermore, since the air gaps 43 are formed after forming the ohmic contact layer 41, an area over that the ohmic contact layer 41 is to be formed may be increased. According to this fact, resistance may be further reduced.

FIGS. 9A to 9D are cross-sectional views explaining a comparative example of the semiconductor device in accordance with the second embodiment of the present invention.

Figure 9A:
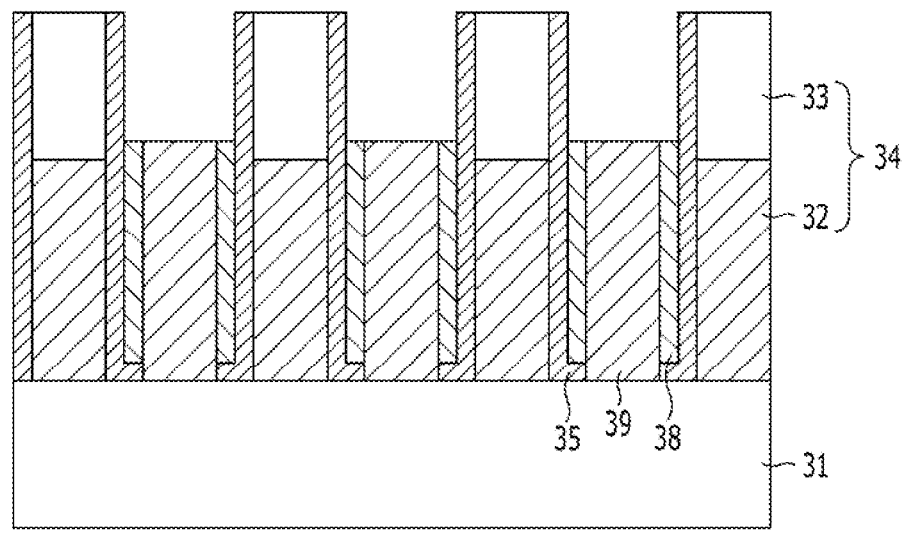
FIGS. 9A to 9D are cross-sectional views explaining a comparative example of the semiconductor device in accordance with the second embodiment of the present invention.
Figure 9B:
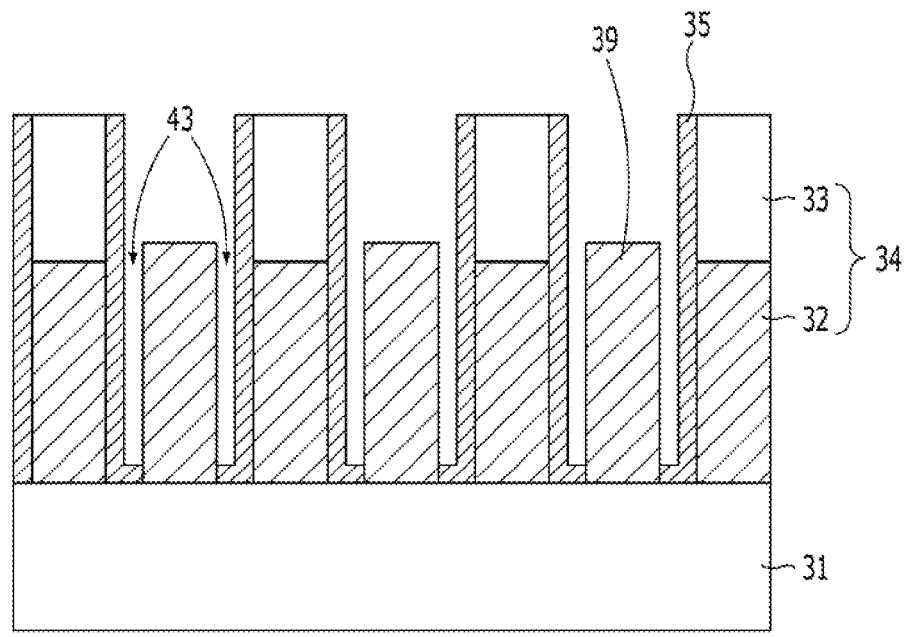

Referring to FIG. 9A, a plurality of first conductive structures 34 in which first conductive patterns 32 and hard mask patterns 33 are stacked are formed on a substrate 31.

After defining openings (not numbered) between the first conductive structures 34, spacers 35 are formed on the sidewalls of the first conductive structures 34.

Recessed second conductive patterns 39 and recessed sacrificial pacers 38 are formed.

Referring to FIG. 96, air gaps 43 are formed by removing the sacrificial spacers 38.

Figure 9C:
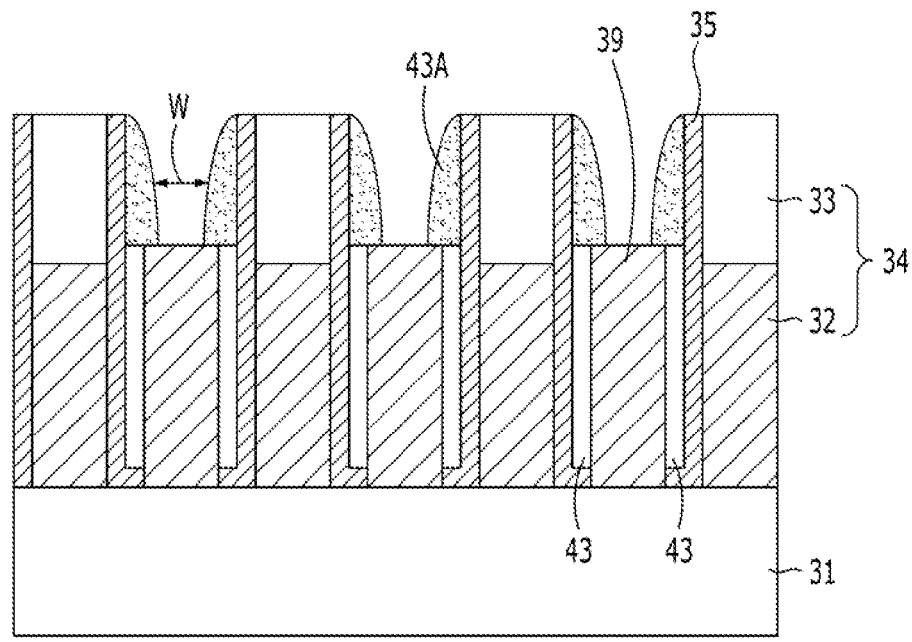

Referring to FIG. 9C, capping spacers 43A are formed to cap the air gaps 43.

Figure 9D:
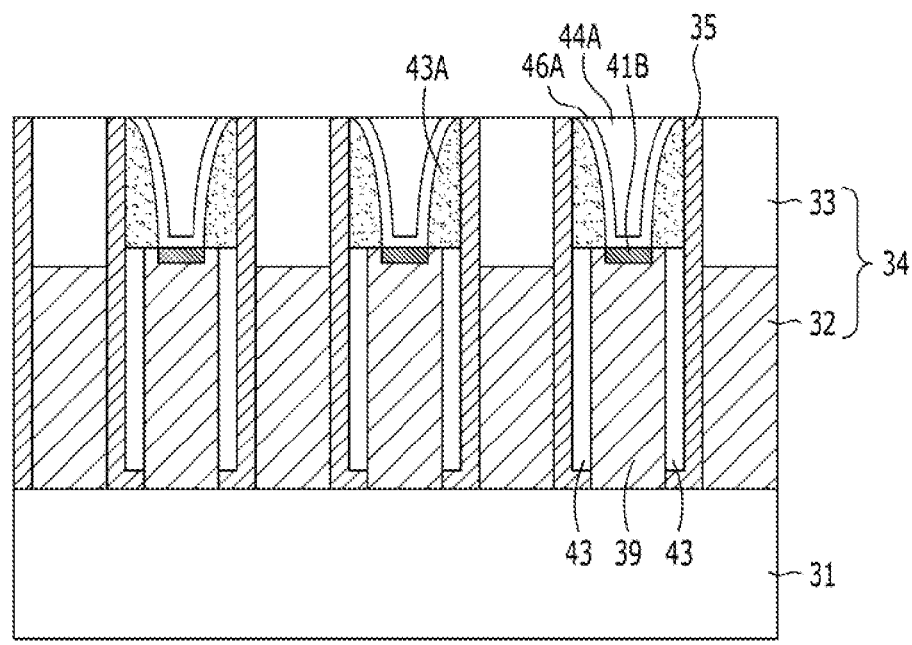

Referring to FIG. 9D, an ohmic contact layer 416, barrier patterns 46A and third conductive patterns 44A are formed on the second conductive patterns 39.

In this comparative example, as the sacrificial spacers 38, a material such as silicon oxide, silicon nitride or titanium nitride is used. In order to define the air gaps 43, the sacrificial spacers 38 are removed using a wet etching process.

However, in the comparative example, in the case here the sacrificial spacers 38 are formed using titanium nitride, it is difficult to cleanly remove the titanium nitride, and being-not-open of the air gaps 43 occurs. Also, when removing the titanium nitride, surrounding structures are likely to be lost.

Moreover, in the comparative example, in the case where the thickness of each of the capping spacers 43A is substantial to sufficiently cap the air gaps 43, spaces for forming the third conductive patterns 44A (see the reference symbol W in FIG. 9C) and areas for forming the ohmic contact layer 416 become narrow, so contact resistance increases. Further, in the comparative example, since the line width of each of the second conductive patterns 39 decreases by the spaces of the air gaps 43, areas for subsequently forming the ohmic contact layer 41B decrease.

Furthermore, in the comparative example, in the case where the thicknesses of the capping spacers 43A are thin, a problem is caused in that the air gaps 43 are likely to be open when forming the capping spacers 43A. In addition, during a stripping process and a cleaning process performed in the course of subsequently forming the ohmic contact layer 41B, the capping spacers 43A are likely to be lost and thus the air gaps 43 are likely to be open. Due to this fact, the barrier patterns 46A and the third conductive patterns 44A are likely to be introduced into the air gaps 43 and fill the air gaps 43.

Besides, in the comparative example, because the volume of each of the second conductive patterns 39 including a silicon-containing layer is relatively larger than the volume of each of the third conductive patterns 44A including a metal-containing layer, resistance increases. Accordingly, limitations exist in increasing the resistance of each of contact plugs.

As a result, in consideration of these facts, in the present embodiments, by increasing the volume of a metal-containing material, resistance may be reduced. Also, since the air gaps 43 are formed after forming the ohmic contact layer 41 in advance, areas for forming the ohmic contact layer 41 may be increased and thus contact resistance may be reduced. Further, since the air gaps 43 are capped using the barrier patterns 46 and the fourth conductive patterns 44, spaces for forming the fourth conductive patterns 44 are sufficiently secured, by which contact resistance is reduced. Moreover, due to the fact that a stripping process and a cleaning process performed after forming the ohmic contact layer 41 are performed earlier than the process for defining the air gaps 43, the loss of the air gaps 43 may be minimized. Since the air gaps 43 are capped by the barrier patterns 46 and the fourth conductive patterns 44, the air gaps 43 may be stably capped. Furthermore, since capping spacers using a dielectric material are omitted, processes may be simplified.

Figure 10A:
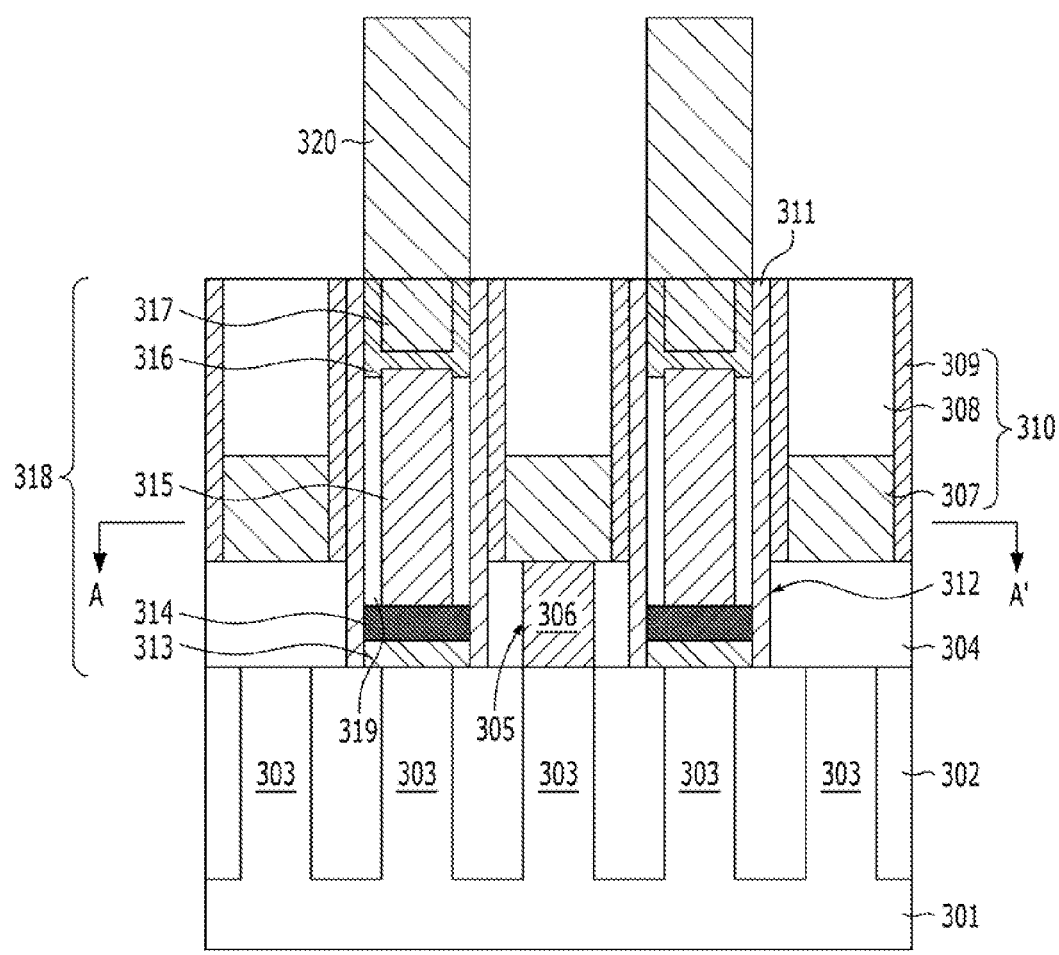
FIG. 10A is a cross-sectional view illustrating portions of memory cells.
Figure 10B:
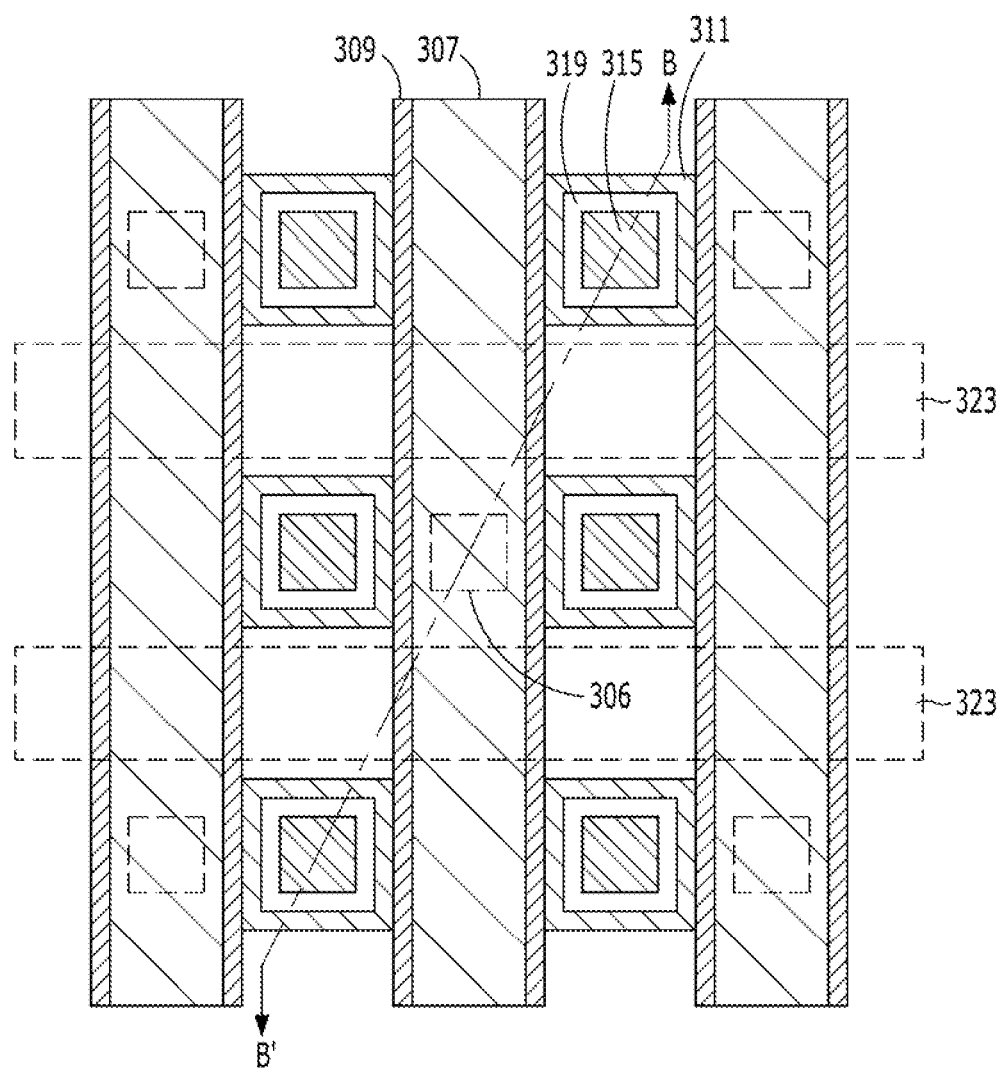
FIG. 10B is a plan view taken along the line A-A' of FIG. 10A.
Figure 10C:
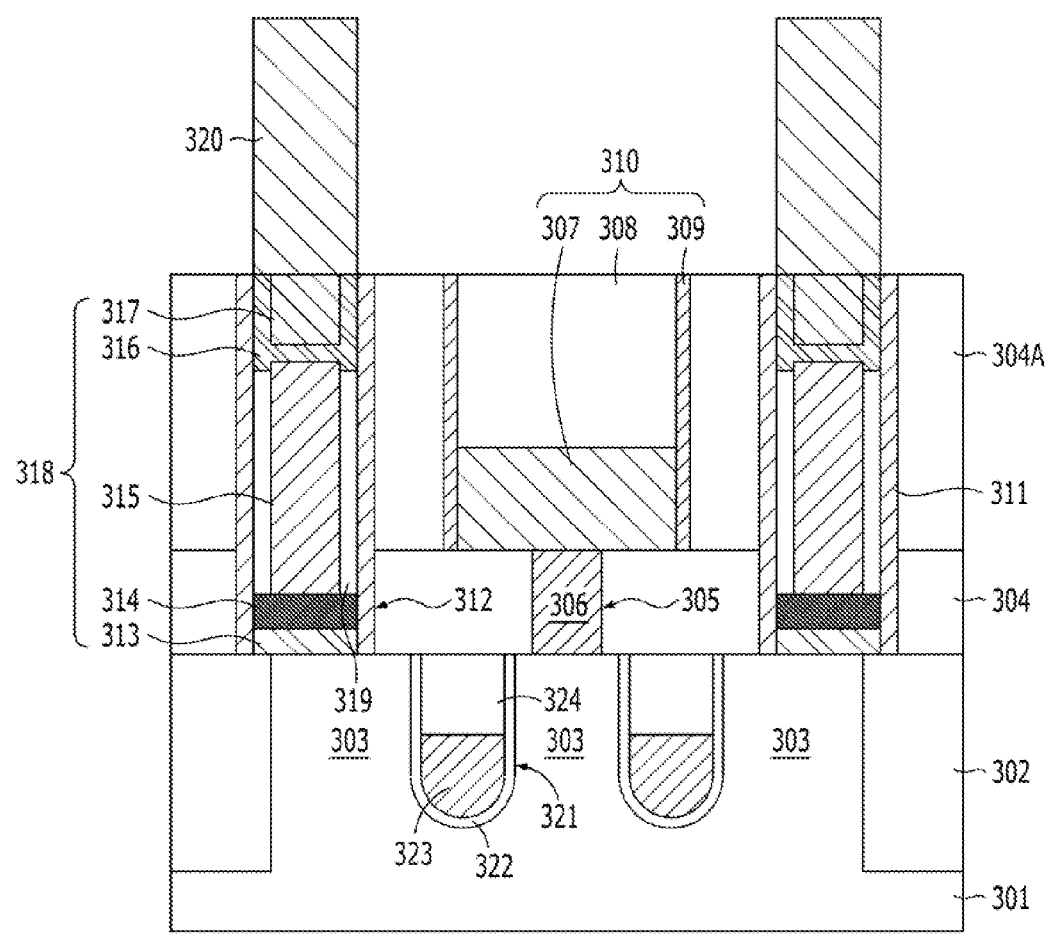
FIG. 10G is a cross-sectional view taken along the line B-B' of FIG. 10G.

FIG. 10A is a cross-sectional view illustrating portions of memory cells. FIG. 10B is a plan view taken along the line A-A' of FIG. 10A. FIG. 10C is a cross-sectional view taken along the line B-B' of FIG. 10B. The memory cells shown in FIG. 10A include DRAM memory cells.

Referring to FIGS. 10A, 10B and 10C active regions 303 are formed in a substrate 301 by isolation regions 302. Gate trenches 321 are formed to extend across the active regions 303. A gate dielectric layer 322 is formed on the surfaces of the gate trenches 321. Buried gate electrodes 323 are formed on the gate dielectric layer 322 to partially fill the gate trenches 321. While not shown, source regions and drain regions are formed in the substrate 301. A sealing layer 324 is formed on the buried gate electrodes 323. Bit line structures 310, which include bit lines 307 extending in a direction crossing with the buried gate electrodes 323, are formed.

Each of the bit line structures 310 includes a bit line 307, a bit line hard mask 308 and bit line spacers 309. The bit line 307 is connected with the active region 303 through a bit line contact plug 306. The bit line contact plug 306 is formed in a bit line contact hole 305 that is formed in a first interlayer dielectric layer 304.

Storage node contact plugs 318 are formed to be to connected with the active regions 303. The storage node contact plugs 318 are formed in storage node contact holes 312 that are formed to pass through the first interlayer dielectric layer 304 and a second interlayer dielectric layer 304A. Spacers 311 are formed on the sidewalls of the storage node contact holes 312. Each of the storage node contact plugs 318 includes a first plug 313, an ohmic contact layer 314, a second plug 315, a barrier pattern 316, and a third plug 317. The first plug 313 is a silicon plug that includes polysilicon. The second plug 315 and the third plug 317 are metal plugs that include tungsten. The ohmic contact layer 314 includes a metal silicide. The ohmic contact layer 314 includes cobalt silicide with the phase of $CoSi_2$. The barrier pattern 316 includes titanium nitride. The first plug 313 has a surface that is recessed to have a height lower than the lower surface of the bit line 307.

Insulation structures including air gaps 319 and the spacers 311 are formed between the storage node contact plugs 318 and the bit lines 307. Each of the second plugs 315 is separated from the sidewalls of the bit lines 307 by the air gaps 319. The air gaps 319 are capped by the barrier patterns 316. The air gaps 319 and the barrier patterns 315 may be formed and formed by applying the methods explained in the above embodiments. The barrier patterns 316 cap the upper surfaces of the second plugs 315 and the air gaps 319.

Capacitors including storage nodes 320 are connected to the storage node contact plugs 318 from the top. Each of the storage nodes 320 includes a pillar shape. While not shown, a dielectric layer and plate nodes may be additionally formed on the storage nodes 320. Each of the storage nodes 320 may include a cylinder shape instead of the pillar shape.

As can be seen from the above descriptions, each memory cell includes a buried gate type transistor including the buried gate electrode 322, the bit line 307, the storage node contact plug 318, and the capacitor. The storage node contact plug 318 is separated from the sidewalls of the bit lines 307 by the air gaps 319. The parasitic capacitance between the bit line 307 and the storage node contact plug 318 is produced between the second plug 315 and the bit line 307. The entire resistance of each storage node contact plug 318 is reduced by the second plug 315 as a metal-containing material. The parasitic capacitance between the bit line 307 and the storage node contact plug 318 is reduced due to the presence of the air gaps 319.

FIGS. 11A to 11K are cross-sectional views showing an exemplary method for fabricating memory cells.

Figure 11A:
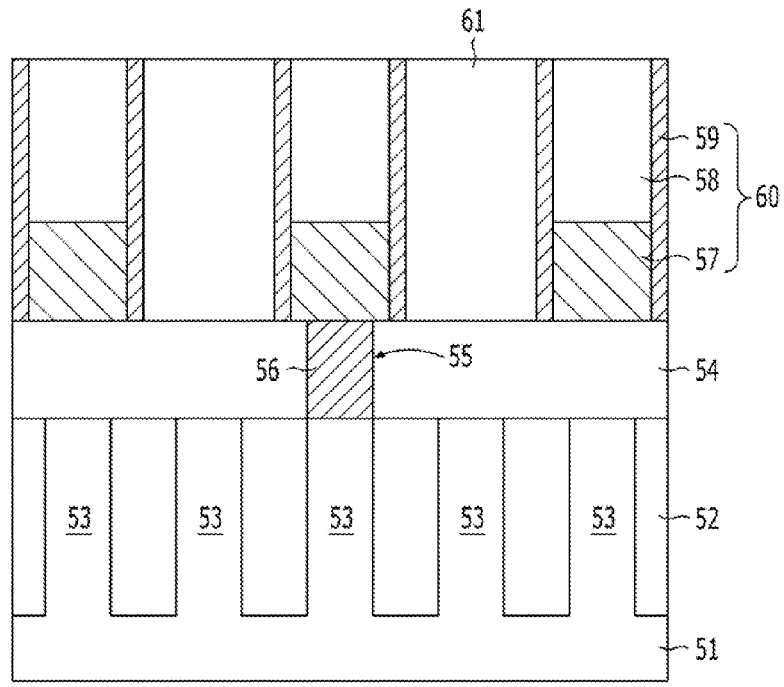
FIGS. 11A to 11K are cross-sectional views showing an exemplary method for fabricating memory cells.

Referring to FIG. 11A, a substrate 51 contains silicon. The substrate 51 may include a silicon substrate or a silicon germanium substrate. Also, the substrate 51 may include an SOI substrate.

Isolation regions 52 are formed in the substrate 51. The isolation regions 52 may be formed by an STI (shallow trench isolation) process. Active regions 53 are formed by the isolation regions 52. As the isolation regions 52, a wall oxide, a liner and a gapfill material may be sequentially formed. The liner may include silicon nitride or silicon oxide. The silicon nitride may include $Si_3N_4$, and the silicon oxide may include $SiO_2$. The gapfill material may include silicon oxide such as a spin-on-dielectric (SOD). Also, the gapfill material may include silicon nitride, and the silicon nitride may use the silicon nitride that is used as the liner.

While not shown, after forming the isolation regions 52, buried gate electrodes (see the reference numeral 323 in FIG. 10C) may be formed. A method for forming the buried gate electrodes will be described with reference to FIG. 10C. First, after defining gate trenches 321 by etching the substrate 301, the buried gate electrodes 323 are formed to be recessed in the gate trenches 321. Thereafter, the sealing layer 324 is formed on the buried gate electrodes 323. Before forming the buried gate dielectric layer 322 may be formed on the surfaces of the gate trenches 321. The buried gate electrodes 323 may be formed by forming a metal-containing layer to gapfill the gate trenches 321 and then etching back the metal-containing layer. The metal-containing layer may include a material that includes a metal, such as titanium, tantalum and tungsten, as a main constituent. The metal-containing layer may include at least any one selected from the group consisting of tantalum nitride (TaN), titanium nitride (TiN), tungsten nitride (WN) and tungsten (W). For example, the buried gate electrodes 323 may independently include titanium nitride, tantalum nitride or tungsten, or may be formed into a double layered structure such as TiN/W in which a tungsten (W) layer is stacked on a titanium nitride (TiN) layer or TaN/W in which a tungsten (W) layer is stacked on a tantalum nitride (TaN) layer. Also, the buried gate electrodes 323 may include a double layered structure such as WN/W in which a tungsten (W) layer is stacked on a tungsten nitride (WN) layer, and besides, may include a metallic material with low resistance. The sealing layer 324 may gapfill the gate trenches 321 on the buried gate electrodes 323. The sealing layer 324 may perform the function of protecting the buried gate electrodes 323 from a subsequent process. The sealing layer 324 may include a dielectric material. The sealing layer 324 may include a silicon nitride. After forming the sealing layer 324, source regions and drain regions may be formed in the active regions 303. Consequently, buried gate type transistors including the buried gate electrodes 323 are formed.

Referring back to FIG. 11A, a first interlayer dielectric layer 54 is formed on the entire surface of the substrate 51. The first interlayer dielectric layer 54 may include a silicon oxide or a silicon nitride. The first interlayer dielectric layer 54 serves as an interlayer dielectric layer. An etch stop layer (not shown) including silicon nitride may be additionally formed on the first interlayer dielectric layer 54.

Bit line contact holes 55 are formed by etching the first interlayer dielectric layer 54. In order to define the bit line contact holes 55, mask patterns (not shown) may be used as an etch mask. After defining the bit line contact holes 55, the active regions 53 may be recessed by a predetermined depth. By this fact, it is possible to increase the contact area between bit line contact plugs 56 that are to be subsequently formed and the active regions 53. The active regions 53 that are exposed by the bit line contact holes 55 include any one regions of source regions and drain regions of the buried gate type transistors.

The bit line contact plugs 56 are formed in the bit line contact holes 55. The bit line contact plugs 56 have shapes that fill the bit line contact holes 55. After forming a conductive layer (not shown) on the entire surface to gapfill the bit line contact holes 55, the conductive layer may be planarized. In this way, the bit line contact plugs 56 may be formed. The bit line contact plugs 56 may include a polysilicon layer or a metal layer.

Bit lines 57 and bit line hard masks 58 are formed on the bit line contact plugs 56. In another embodiment, the line widths of the bit lines 57 and the line widths of the bit line hard masks 58 each may be set to be smaller than those of the bit line contact holes 55 such that even the bit line contact plugs 56 are etched. Although the sidewalls of the bit line contact holes 55 may be open again as the bit line contact plugs 56 are etched, bit line spacers 59 that are to be subsequently formed may gapfil open spaces. The bit lines 57 include a metal-containing layer such as tungsten. The bit line hard masks 58 include silicon nitride.

Bit line spacers 59 are formed on the sidewalls of the bit lines 57 and the bit line hard masks 58. The bit line spacers 59 may include a silicon nitride.

By forming the bit line spacers 59 as described above, bit line structures 60, each including the bit line 57, the bit line hard mask 58 and the bit line spacers 59, are formed.

A second interlayer dielectric layer 61 is formed on the bit line structures 60. The second interlayer dielectric layer 61 may be subsequently patterned or planarized to be gapfilled between adjacent bit line structures 60.

Figure 11B:
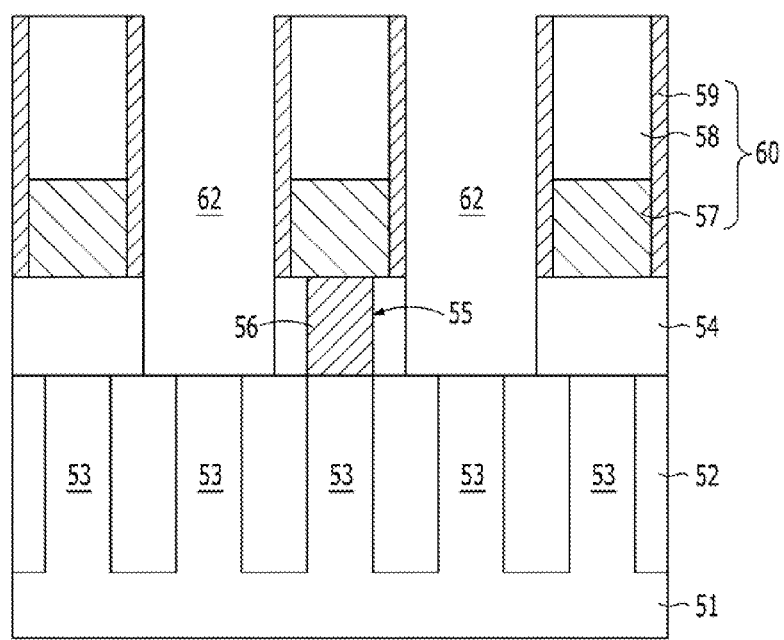

Referring to FIG. 11B, the second interlayer dielectric layer 61 and the first interlayer dielectric layer 54 are etched using unillustrated mask patterns as an etch mask. According to this fact, storage node contact holes 62 are formed between the bit line structures 60. The storage node contact holes 62 may be formed in a self-aligned manner by the bit line structures 60. Therefore, the sidewalls of adjacent bit line structures 60 are exposed by the storage node contact holes 62. Portions of the substrate 51 are exposed by the storage node contact holes 62. The active regions 53 that are exposed by the storage node contact holes 62 include any one regions of the source regions and drain regions of the buried gate type transistors. While not shown, the lower portions of the storage node contact holes 62 may be enlarged by subsequently performing wet etching. At this time, portions of the first interlayer dielectric layer 54 are etched.

Figure 11C:
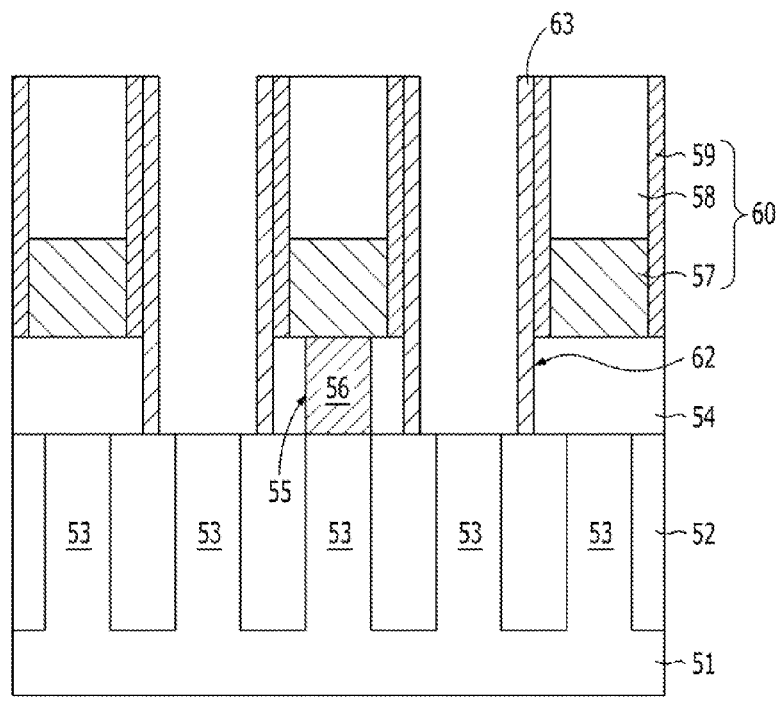

Referring to FIG. 11C, spacers 63 are formed on the sidewalls of the storage node contact, holes 62. For instance, a dielectric layer (not shown) is formed. The dielectric layer is etched back. According to this fact, the spacers 63 are formed. The spacers 63 are formed on the sidewalls of the storage node contact holes 62. By forming the spacers 63, the surfaces of active regions 53 are exposed on the bottoms of the storage node contact holes 62.

Figure 11D:
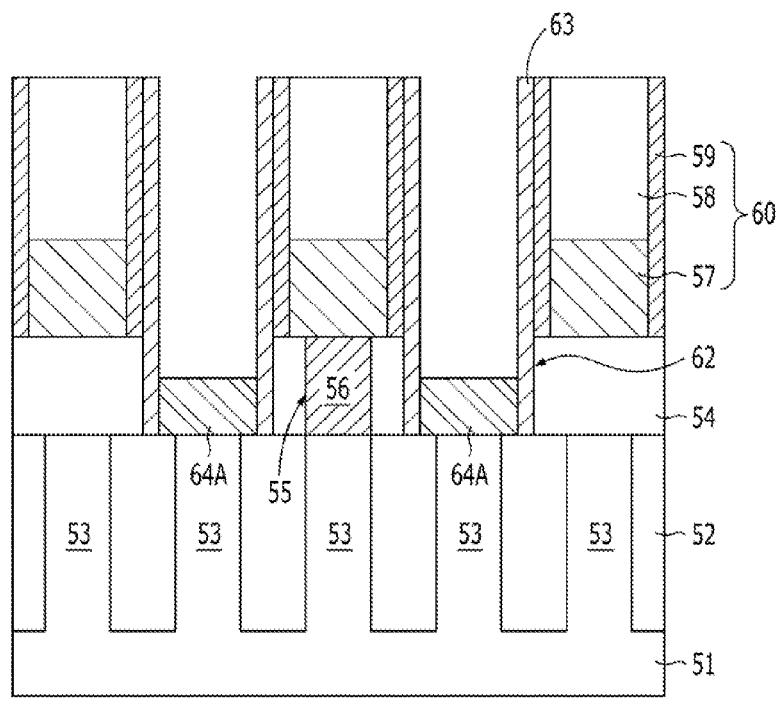

Referring to FIG. 11D, first plugs 64A are formed in the storage node contact holes 62. The first plugs 64A have shapes that partially fill the storage node contact holes 62. Namely, the first plugs 64A are formed to be recessed in the storage node contact holes 62. The first plugs 64A are formed by forming a conductive layer (not shown) on the entire surface to gapfill the storage node contact holes 62 and then recessing the conductive layer. The recessed surfaces of the first plugs 64A may be controlled to be lower than at least the lower surfaces of the bit lines 57. By this fact, the bit lines 57 and the first plugs 64A do not confront each other. The first plugs 64A include a silicon-containing layer. The first plugs 64A may include a polysilicon layer. The first plugs 64A become silicon plugs.

Figure 11E:
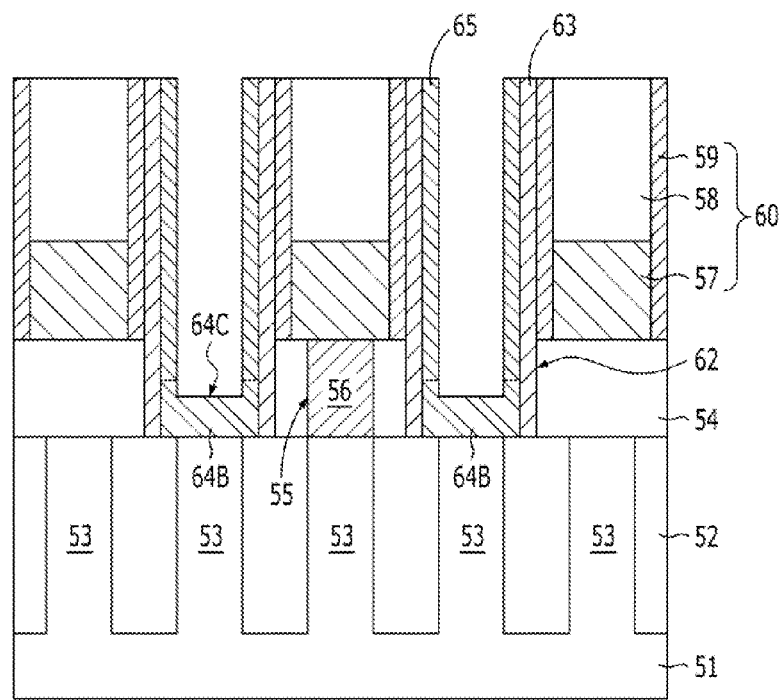

Referring to FIG. 11E, sacrificial spacers 55 are formed on the sidewalls of the storage node contact holes 62 on the first plugs 64A. The sacrificial spacers 65 may be formed by selectively etching a sacrificial layer (not shown). In order to form the sacrificial spacers 65, a dry etching process may be applied. For instance, the dry etching process may include an etch-back process. The upper surfaces of the first plugs 64A are exposed by the sacrificial spacers 65. The sacrificial spacers 65 are a material that is removed in a subsequent process to define air gaps. The sacrificial spacers 65 may include a dielectric material. The sacrificial spacers 65 may include silicon oxide or silicon nitride. The sacrificial spacers 65 may be formed by stacking silicon oxide and silicon nitride.

When forming the sacrificial spacers 65 or after forming the sacrificial spacers 65, the surfaces of the first plugs 64A may be recessed by a predetermined depth (see the reference numeral 64C). The first plugs 64A recessed in this way have shapes as indicated by the reference numeral 648. This is to increase a reaction area for subsequently forming a silicide layer.

Figure 11F:
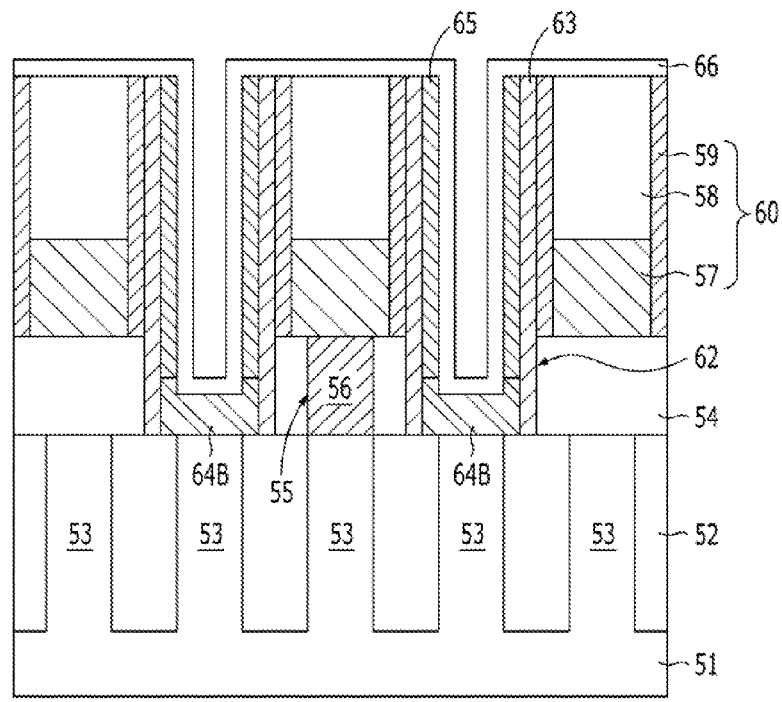

Referring to FIG. 11F, a silicidable layer 66 is formed. The silicidable layer 66 is conformally formed on the entire surface including the sacrificial spacers 65 and the first plugs 64B. The silicidable layer 66 includes a material that forms a metal silicide by a silicidation reaction with the first plugs 64B. The silicidable layer 66 includes a silicidable metal layer. The silicidable metal layer may include a metal-containing layer that contains metal atoms such as cobalt. In the case where the first plugs 64B include polysilicon, the silicidable layer 66 may include cobalt. The silicidable layer 66 may be deposited by PVD.

By forming the silicidable layer 66 as described above, a reaction area for forming a silicide of the silicidable layer 66 and the first plugs 64B is increased. For example, the increased reaction area includes a reaction area by the recessed surface of each first plug 64B and reaction areas by the projections of each first plug 64B. This is due to an increase in the line width of the first plug 64B.

While not shown, a protective layer may be formed on the silicidable layer 66. The protective layer is conformally formed on the silicidable layer 66. The protective layer prevents a silicide layer from being attacked in a subsequent silicidation process. The protective layer includes a metal nitride. The protective layer includes a titanium-containing layer. The protective layer may include titanium nitride (TiN). The protective layer may be formed by stacking a titanium (Ti) layer and a titanium nitride (TIN) layer.

Figure 11G:
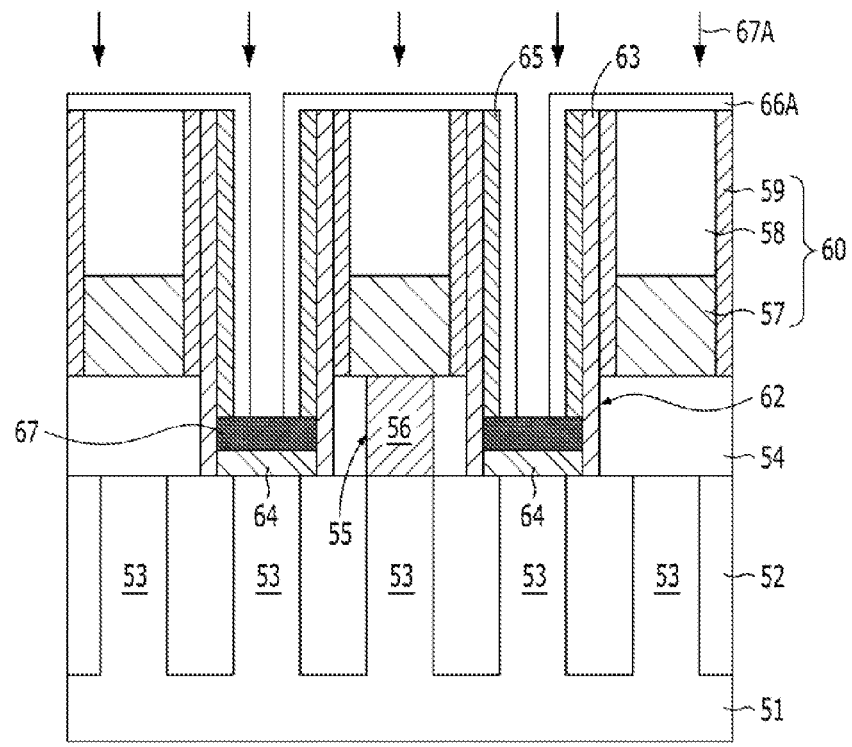

Referring to FIG. 11G, an ohmic contact layer 67 is formed. In order to form the ohmic contact layer 67, annealing 67A may be performed. The ohmic contact layer 67 is formed as the first plugs 646 and the silicidable layer 66 react with each other by the annealing 67A. A silicidation reaction occurs by the annealing 67A. In detail, the silicidation reaction occurs at an interface where the first plugs 64B and the silicidable layer 66 contact each other, by which the ohmic contact layer 67 including a metal silicide layer is formed. The annealing 67A may be performed at a temperature of at least 200° C. to cause the silicidation reaction to occur between the silicidable layer 66 and the first plugs 64B. The annealing 67A includes rapid thermal annealing (RTA). As the silicon atoms of the first plugs 64B and the metal atoms of the silicidable layer 66 react with each other by the annealing 67A the ohmic contact layer 67 is formed. The ohmic contact layer 67 may include cobalt silicide. In the present embodiment, the ohmic contact layer 67 may include cobalt silicide with the phase of $CoSi_2$. To this end, the annealing 67A may be performed twice. For example, primary annealing is performed at a temperature of 400° C. to 600° C. By the primary annealing, cobalt silicide with the phase of $CoSi_x$ ($x=0.1{\sim}1.5$) is formed. Secondary annealing is performed. The secondary annealing includes rapid thermal annealing (RTA). The secondary annealing may be performed at a temperature higher than that of the primary annealing. The secondary annealing is performed at a temperature of 600° C. to 800° C. A phase change occurs in the ohmic contact layer 67 by the secondary annealing. For example, the cobalt silicide with the phase of $CoSi_x$ ($x=0.1{\sim}1.5$) is formed by the primary annealing, and a phase change to cobalt silicide with the phase of $CoSi_2$ occurs by the secondary annealing. Among cobalt silicides, the specific resistance of the cobalt silicide with the phase of $CoSi_2$ is lowest.

After the ohmic contact layer 67 is formed, the silicidable layer 66A that has not reacted may remain. Each of the first plugs 64B may be reduced in its volume as indicated by the reference numeral 64.

When performing the annealing 67A, since the reaction area of silicon, which is involved in the silicidation reaction, is increased by the recessed surface and the projections of each first plug 64B, it is possible to form cobalt silicide with the phase of $CoSi_2$ having low specific resistance. In the case where the surface of each first plug 64B is not recessed, the reaction area of silicon that is involved in the silicidation reaction may be insufficient, and a cobalt silicide with the phase of $Co_2Si$ having high specific resistance may be formed.

By forming the cobalt silicide with the phase of $CoSi_2$ as the ohmic contact layer 67 as described above, contact resistance may be reduced, and at the same time, it is possible to form cobalt silicide with low resistance even in the small area of each storage node contact hole 62 with a fine line width.

Figure 11H:
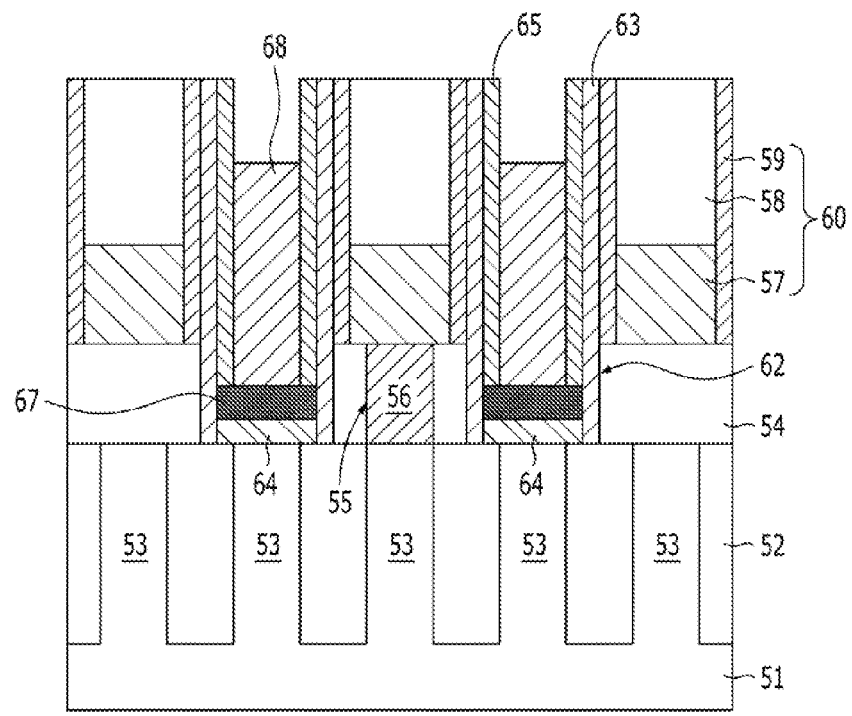

Referring to FIG. 11H, the unreacted silicidable layer 66A is removed.

Second plugs 68 are formed on the ohmic contact layer 67. The second plugs 68 are formed on the ohmic contact layer 67 in such a way as to be recessed in the storage node contact holes 62. The second plugs 68 may include a metal-containing layer. The second plugs 68 may include a material that contains tungsten. The second plugs 68 may include a tungsten layer or a tungsten compound. The second plugs 68 are formed in such a way as to be recessed to be lower than the surfaces of the bit line structures 60. By the second plugs 68, the sacrificial spacers 65 may be partially exposed.

The volume of each second plug 68 is larger than the volume of each first plug 64. The second plugs 68 are formed adjacent to the bit lines 57. The first plugs 64 are not adjacent to the bit lines 57.

Figure 11I:
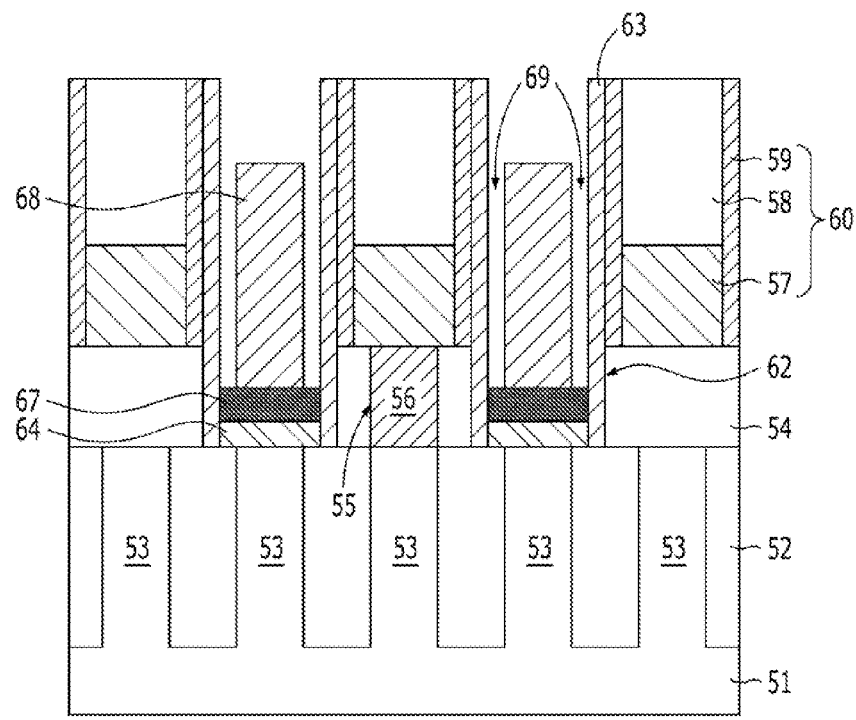

Referring to FIG. 11I, air gaps 69 are formed by removing the sacrificial spacers 65. The air gaps 69 are formed between the second plugs 68 and the sidewalls of the bit line structures 60. The sacrificial spacers 65 may be removed by wet etching. In order to remove the sacrificial spacers 65, a cleaning process using a wet type chemical may be performed.

The sacrificial spacers 65 are removed by the above-described sacrificial spacer removing process, and the spaces that have been occupied by the sacrificial spacers 65 become the air gaps 69.

The air gaps 69 are formed between the second plugs 68 and the sidewalls of the bit line structures 60, and insulation structures constituted by the air gaps 69 and the spacers 63 are formed between the second plugs 68 and the sidewalls of the bit line structures 60. The ohmic contact layer 67 is exposed at the bottoms of the air gaps 69, whereas the first plugs 64 are not exposed.

Since a material used as the sacrificial spacers 65 is silicon oxide or silicon nitride, when removing the sacrificial spacers 65, it is possible to prevent being-not-open of the air gaps 69 and loss of the bit line structures 60.

Figure 11J:
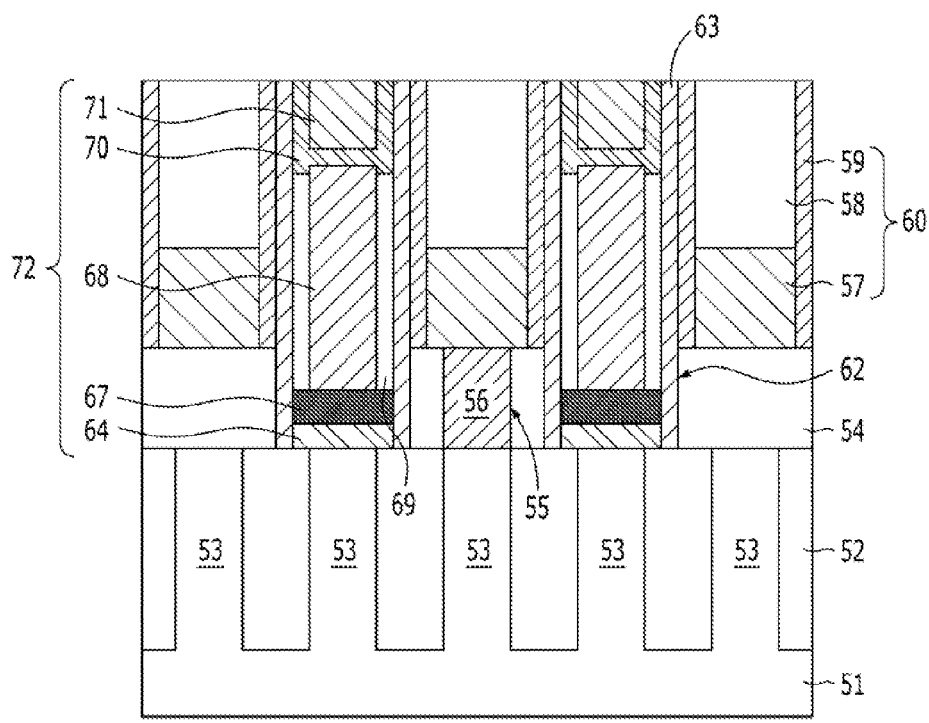

Referring to FIG. 11J conductive structures are formed to cap the second plugs 68 and the air gaps 69. For example, barrier patterns 70 and third plugs 71 are formed.

First, the barrier patterns 70 cap the air gaps 69. A material used to form the barrier patterns 70 is controlled in its thickness not to fill the air gaps 69 but to cap the air gaps 69. By controlling the thickness in this way, it is possible to cover the upper surfaces of the second plugs 68 and cap the air gaps 69. The barrier patterns 70 include a titanium-containing layer. The barrier patterns 70 include titanium nitride.

The third plugs 71 have shapes that gapfill the remaining portions of the storage node contact holes 62 on the barrier patterns 70. The third plugs 71 may include a metal-containing layer. The third plugs 71 may include a tungsten layer.

In this way, the barrier patterns 70 and the third plugs 71 are formed on the second plugs 68. Accordingly, each of storage to node contact plugs 72 that are formed in the storage node contact holes 62 includes the first plug 64, the ohmic contact layer 67, the second plug 68, the barrier pattern 70 and the third plug 71. The ohmic contact layer 67 forms ohmic contacts between the first plugs 64 and the second plugs 68. The barrier patterns 70 prevent interdiffusion between the second plugs 68 and the third plugs 71. Since the first plugs 64 include a silicon-containing layer and the second plugs 68 and the third plugs 71 include a metal-containing layer, semi-metal plug structures are realized.

The air gaps 69 are formed between the second plugs 68 and the sidewalls of the storage node contact holes 62. Insulation structures including the air gaps 69 and the spacers 63 are formed between the storage node contact plugs 72 and the bit line structures 60. The air gaps 69 are capped by the barrier patterns 70.

In another embodiment, the air gaps 69 and the second plugs 68 may be capped using, for example, only the third plugs 71.

Figure 11K:
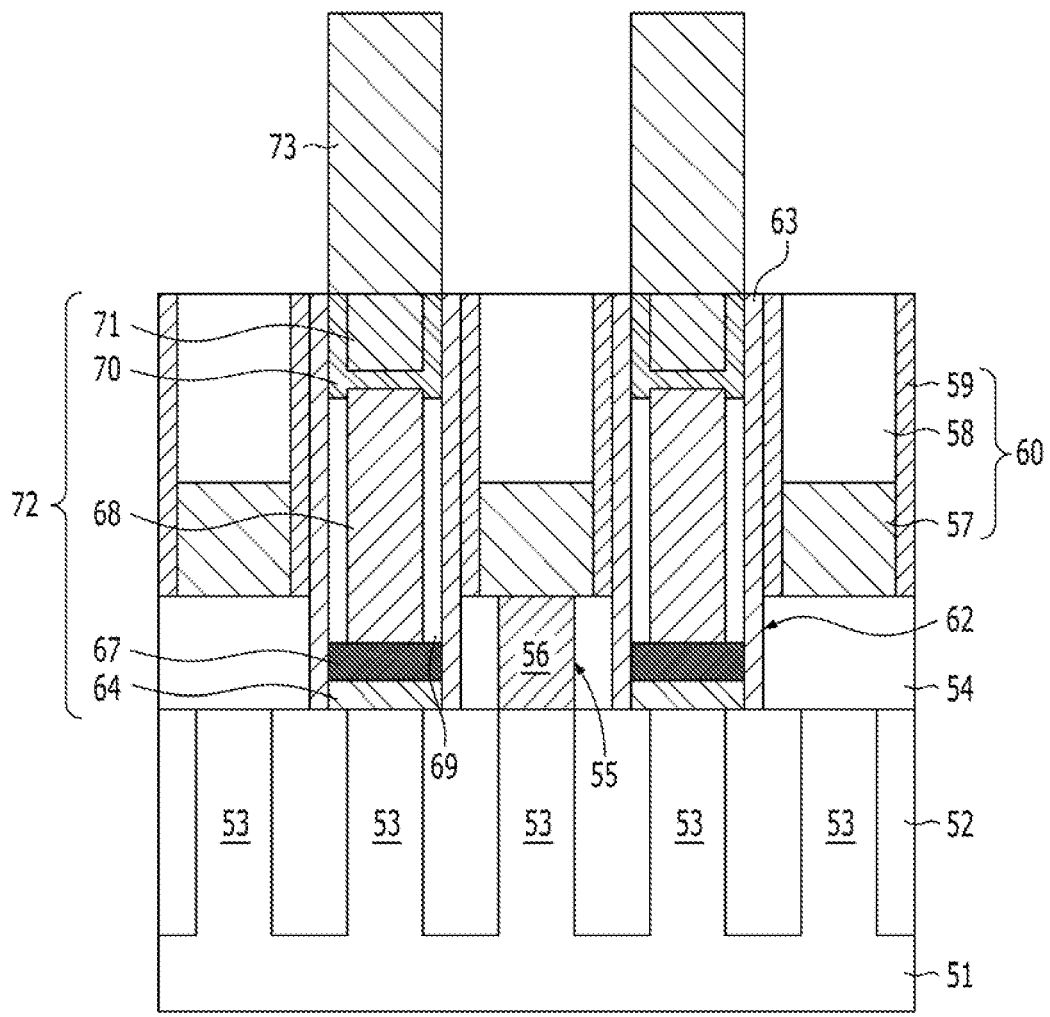

Referring to FIG. 11K, storage nodes 73 are formed on the storage node contact plugs 72. While not shown, a dielectric layer and plate nodes may be formed on the storage nodes 73. The storage nodes 73 have pillar shapes and may have cylinder shapes in another embodiment.

The semiconductor devices according to the above-described embodiments may be applied to a DRAM (dynamic random access memory), without a limiting sense, and may also be limited to a memory such as an SRAM (static random access memory), a flash memory, an FeRAM (ferroelectric random access memory), an MRAM (magnetic random access memory) and a PRAM (phase change random access memory).

Figure 12:
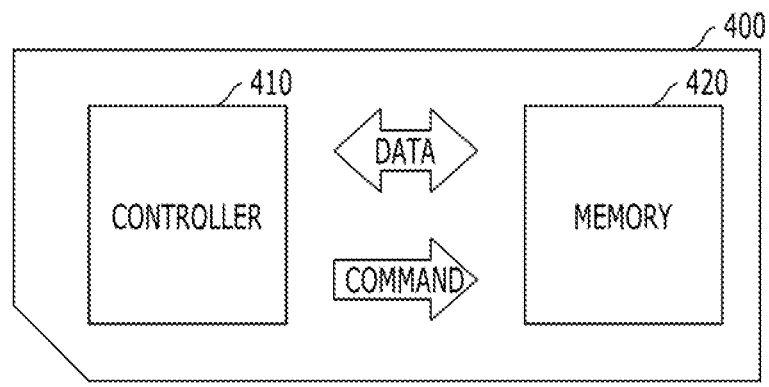
FIG. 12 is a schematic diagram showing a memory card.

FIG. 12 is a schematic diagram showing a memory card.

Referring to FIG. 12, a memory card 400 may include a controller 410 and a memory 420. The controller 410 and the memory 420 may exchange electric signals. For instance, the memory 420 and the controller 410 may exchange data according to a command from the controller 410. According to this fact, the memory card 400 may store data in the memory 420 or output data from the memory 420 to an outside. The memory 420 may include the semiconductor device with air gaps described above. The memory card 400 may be used as data storage media of various portable appliances. For example, the memory card 400 may include a memory stick card, a smart media card (SM), a secure digital (SD), a mini secure digital card (mini SD), or a multimedia card (MMC).

Figure 13:
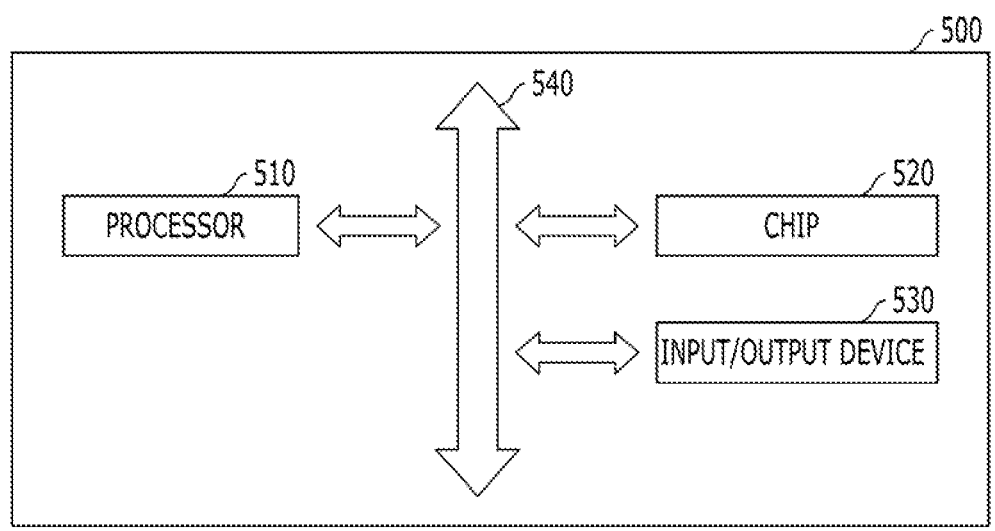
FIG. 13 is a block diagram showing an electronic system.

FIG. 13 is a block diagram showing an electronic system.

Referring to FIG. 13, an electronic system 500 may include a processor 510, an input/output device 530, and a chip 520 that may implement data communication by using a bus 540. The processor 510 may play a role of executing a program and controlling the electronic system 500. The input/output device 530 may be used in inputting and outputting data to and from the electronic system. The electronic system 500 may be connected with an external device, for example, a personal computer or a network, by using the input/output device 530, and may exchange data with the external device. The chip 520 may store codes and data for operations of the processor 510 and may perform some operations ordered from the processor 510. For instance, the chip 520 may include the semiconductor device with air gaps described above. The electronic system 500 may constitute various electronic control apparatuses that need the chip 520, and may be used for example, in a mobile phone, an MP3 player, a navigator, a solid state disk (SSD), a household appliance, etc.

As is apparent from the above descriptions, according to the embodiments, since air gaps are formed between conductive structures, parasitic capacitance may be reduced.

Also, according to the embodiments, since the air gaps are capped using barrier patterns, processes may be simplified and it is possible to stably cap the air gaps.

Further, according to the embodiments, since an ohmic contact layer is formed to have a wide area, contact resistance may be reduced.

Moreover, according to the embodiments, since the volume of a metal-containing material that occupies a conductive structure is increased, the resistance of the conductive structure may be reduced.

As a consequence, according to the embodiments, parasitic capacitance and contact resistance may be simultaneously reduced.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device comprising:
    forming a dielectric layer over a substrate;
    forming an opening by etching the dielectric layer;
    forming a first conductive pattern in the opening;
    forming sacrificial spacer on sidewalls of the opening over the first conductive pattern;
    forming an ohmic contact layer over the first conductive pattern;
    forming a second conductive pattern over the ohmic contact layer;
    forming air gap by removing the sacrificial spacer; and
    forming a third conductive pattern over the second conductive pattern to cap the air gap.

2. The method of claim 1, wherein the forming of the third conductive pattern includes:
    forming a barrier layer over an entire surface including the second conductive pattern and the air gap;
    forming a conductive layer over the barrier layer to fill the opening; and
    planarizing the conductive layer and the barrier layer.

3. The method of claim 2, wherein of the barrier layer and the conductive layer include a metal-containing material, respectively.

4. The method of claim 1, further comprising:
    after the forming of the sacrificial spacer, recessing a surface of the first conductive pattern.

5. The method of claim 1, wherein the first conductive pattern include a silicon-containing material.

6. The method of claim 1, wherein the second conductive pattern and the third conductive pattern include a metal-containing material respectively.

7. The method of claim 1, wherein the ohmic contact layer includes cobalt silicide with a phase of $CoSi_2$.

8. A method for fabricating a semiconductor device comprising:
    forming a plurality of conductive structures which include first conductive patterns, over a substrate;
    forming a dielectric layer over the conductive structures;
    forming openings between the conductive structures by etching the dielectric layer;
    forming second conductive patterns which are recessed to be lower than the first conductive patterns, in the openings;
    forming sacrificial spacers on sidewalk of the openings over the second conductive patterns;
    forming an ohmic contact layer over the second conductive patterns;
    forming third conductive patterns over the ohmic contact layer, defining air gaps by removing the sacrificial spacers; and
    forming fourth conductive patterns over the third conductive patterns, to cap the air gaps.

9. The method of claim 8, further comprising:
    after the forming of the sacrificial spacers, recessing surfaces of the second conductive patterns in a manner self-aligned with the sacrificial spacers.

10. The method of 8, wherein the first conductive patterns include bit lines.

11. The method of claim 8, wherein stack structures of the second conductive patterns, the ohmic contact layer, the third conductive patterns and the fourth conductive patterns include storage node contact plugs.

12. The method of claim 8, wherein the second conductive patterns include a silicon-containing material, and the third conductive patterns include a metal-containing material.

13. The method of claim 8, wherein the ohmic contact layer includes cobalt silicide with a phase of $CoSi_2$.

14. The method of claim 8, wherein the forming of the fourth conductive patterns comprising:
    forming a barrier layer to cap the third conductive patterns and the air gaps;
    forming a metal-containing layer over the barrier layer to ill the openings; and
    planarizing the metal-containing layer and the barrier layer.

15. The method of claim 14, wherein the barrier layer includes a titanium-containing material.

16. The method of claim 8, further comprising:
    before the forming of the conductive structures, forming buried gate type transistors which include gate electrodes buried in the substrate.

17. The method of claim 8, further comprising:
    after the forming of the fourth conductive pattern forming capacitors over the fourth conductive patterns.

* * * * *